(12) United States Patent
Hamasaki et al.

(10) Patent No.: US 7,394,665 B2
(45) Date of Patent: Jul. 1, 2008

(54) LSI PACKAGE PROVIDED WITH INTERFACE MODULE AND METHOD OF MOUNTING THE SAME

(75) Inventors: Hiroshi Hamasaki, Hiratsuka (JP); Hideto Furuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 300 days.

(21) Appl. No.: 10/778,030

(22) Filed: Feb. 17, 2004

(65) Prior Publication Data
US 2004/0218372 A1    Nov. 4, 2004

(30) Foreign Application Priority Data
Feb. 18, 2003    (JP)    ............... 2003-039828

(51) Int. Cl.
*H05K 1/11*    (2006.01)
*H05K 1/14*    (2006.01)

(52) U.S. Cl. .................. 361/803; 361/706; 361/767; 361/764; 361/784

(58) Field of Classification Search .......... 361/700–710
See application file for complete search history.

(56) References Cited

U.S. PATENT DOCUMENTS

| 5,585,671 | A  | * | 12/1996 | Nagesh et al. ............. 257/697 |
| 6,906,407 | B2 | * | 6/2005  | Byers et al. ................ 257/686 |
| 6,954,084 | B2 | * | 10/2005 | Islam .......................... 326/37 |
| 2004/0218372 | A1 |  | 11/2004 | Hamasaki et al. |

FOREIGN PATENT DOCUMENTS

| JP | 2-24810 | 2/1990 |
| JP | 4-158565 | 6/1992 |
| JP | 6-214140 | 8/1994 |
| JP | 8-97352 | 4/1996 |
| JP | 8-250657 | 9/1996 |
| JP | 9-236730 | 9/1997 |
| JP | 10-214981 | 8/1998 |
| JP | 2000-82826 | 3/2000 |
| JP | 2000-82828 | 3/2000 |
| JP | 2000-183370 | 6/2000 |
| JP | 2002-94247 | 3/2002 |

(Continued)

OTHER PUBLICATIONS

Definitions of LSI found on the Internet through Google (one sheet).*

(Continued)

*Primary Examiner*—Tuan T. Dinh
(74) *Attorney, Agent, or Firm*—Oblon, Spivak, McClelland, Maier & Neustadt, P.C.

(57) ABSTRACT

In a circuit module package arranged on a mounting board, a circuit module has signal input and output terminals and is mounted on an interposer. The interposer is provided with first signal terminals electrically connected to the signal input and output terminals of the circuit module, second electric terminals for electrically connecting the circuit module to the mounting board, internal wirings electrically connected to the first signal terminals, and first coupling parts electrically connected to the internal wirings. An interface module is provided with a signal transmission line for transmitting the signals and second coupling parts electrically connected to the transmission line. The second coupling part is electrically and mechanically connected to the first coupling parts, respectively.

19 Claims, 18 Drawing Sheets

FOREIGN PATENT DOCUMENTS

| | | |
|---|---|---|
| JP | 2002-232054 | 8/2002 |
| JP | 2002-232058 | 8/2002 |
| KR | 0158783 | 8/1998 |
| KR | 2002-0021366 | 3/2002 |

OTHER PUBLICATIONS

U.S. Appl. No. 10/778,030, filed Feb. 17, 2004, Hamasaki et al.
U.S. Appl. No. 11/015,013, filed Dec. 20, 2004, Furuyama et al.
U.S. Appl. No. 11/081,617, filed Mar. 17, 2005, Furuyama et al.
U.S. Appl. No. 11/204,168, filed Aug. 16, 2005, Furuyama et al.
U.S. Appl. No. 11/203,959, filed Aug. 16, 2005, Hamasaki et al.
U.S. Appl. No. 11/233,175, filed Sep. 23, 2005, Furuyama et al.
Jerome Eichenberger, et al., "Multi-Channel Optical Interconnection Modules up to 2.5Gb/s/ch", Proc. 51st 2001 Electronic Components and Technology Conference, 2001, pp. 880-885.
Takashi Yoshikawa, et al., "Optical-interconnection as an IP macro of a CMOS Library", Proc. Hot Interconnects 9, Symposium on High Performance Interconnects, 2001, pp. 31-35.
M. Okabe, et al., Proc. The 16th JIEP Annual Meeting, 2002, vol. 20B, No. 10, pp. 283-284.
U.S. Appl. No. 11/496,446, filed Aug. 1, 2006, Furuyama et al.

* cited by examiner

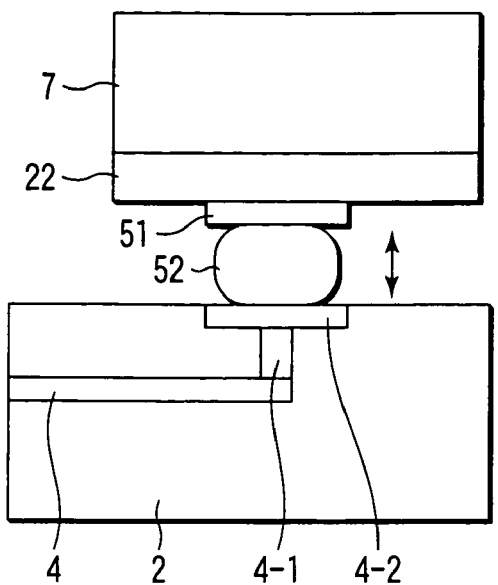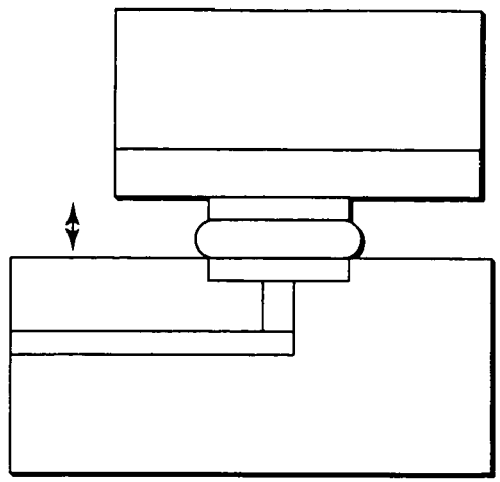
F I G. 21A    F I G. 21B
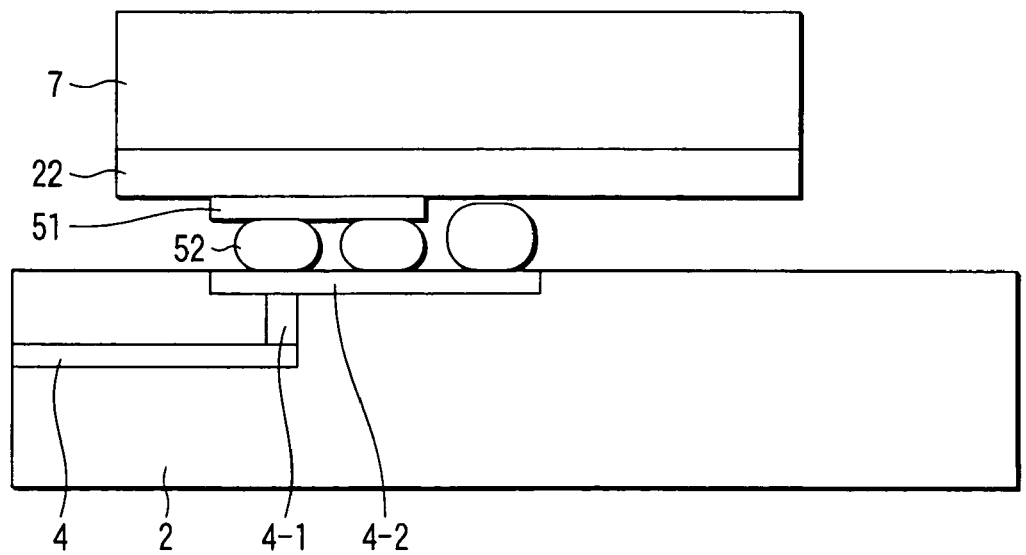
F I G. 21C

LSI PACKAGE PROVIDED WITH INTERFACE MODULE AND METHOD OF MOUNTING THE SAME

CROSS-REFERENCE TO RELATED APPLICATIONS

This application is based upon and claims the benefit of priority from prior Japanese Patent Application No. 2003-039828, filed Feb. 18, 2003, the entire contents of which are incorporated herein by reference.

BACKGROUND OF THE INVENTION

1. Field of the Invention

The present invention relates to an LSI package provided with an interface module and a method of mounting the same, particularly, to an LSI package provided with an interface module for transmitting a signal at a high-speed between the external wiring and the interface module and a method of mounting the same.

2. Description of the Related Art

In recent years, the clock frequency of an LSI is being made higher and higher, and a CPU for a personal computer that is operated under a clock frequency of the order of GHz has been put to a practical use. However, the pace of the improvement in the throughput at the interface between the adjacent LSIs is moderate, compared with the increase in the clock frequency, which constitutes a bottle neck in the performance of the personal computer. Such being the situation, the research and development for improving the throughput in the interface are being conducted vigorously.

For improving the throughput of the interface, it is necessary to increase the signal frequency per terminal and to increase the number of terminals. However, the increase in the number of terminals is limited because, if the number of terminals is increased, the areas of the LSI and the package thereof are enlarged so as to increase the length of the internal wiring, with the result that it is impossible to operate the LSI under a high frequency. It follows that it is of high importance to increase the frequency per terminal. On the other hand, if the frequency per terminal is increased, the attenuation of the electric signal is increased so as to increase the influence on the reflection produced by the impedance mismatch. Such being the situation, the line length is limited. Under the circumstances, it is necessary to use a transmission line that permits greatly suppressing the impedance mismatch and the attenuation amount as a high-speed signal transmission line.

It is effective to use an optical fiber as a long-distance transmission line that is small in the influences produced by the impedance mismatch and by the loss. Therefore, an optical interface module performing the photo-electric converting function is used as the interface module. The interface modules commercialized by using the optical interface module include, for example, the transceiver module disclosed in "Proceedings. 51$^{st}$ Electronic Components and Technology Conference, P.P. 880-5,2001".

In the transceiver module disclosed in the literature quoted above, an LSI for processing signals is incorporated in a PGA (programmable gate array) package. This PGA package is mounted to a mounting board. The input-output signal from the LSI is transmitted through the package into the optical interface module that is mounted to the mounting board and is further transmitted from the optical interface module into a signal line. The optical interface module includes optical elements such as a semiconductor laser element (LD) and a photo-detecting element (PD) as well as an optical fiber, and an optical signal is received from and transmitted to an external circuit through the optical fiber. Also, an interface IC for driving the optical element is housed in the optical interface module so as to be connected to a signal line on the mounting board, to a required control signal line and to a power source line (not shown) through an electrical input-output terminal. Each of the LSI and the optical interface module is provided with a heat sink for the heat dissipation for the cooling.

In the board edge mounting type optical interface module of the configuration described above, the electric signal is converted into an optical signal by the photo-electric converting function so as to permit the converted optical signal to be introduced into the optical fiber. Since the loss is very small and the limitation of the band is small in the optical fiber, it is possible to transmit the signals at a high-speed even if the transmission line is relatively long as in the transmission between mounting boards or between devices. However, in the optical interface module, the electric signal is received and transmitted through the signal line on the mounting board and, thus, the signal transmission is affected by the attenuation of the electric signal on the mounting board or by the impedance mismatch. Since the maximum length of the signal wiring of the mounting board exceeds 30 cm, a highly expensive transmission line is required for transmitting signals having a high frequency, e.g., a signal of 10 Gbps, so as to give rise to the problem that the cost of the mounting board is increased.

Under the circumstances, an improved technology for the signal transmission at a high-speed is proposed in, for example, "HOT9 Interconnects, Symposium on High Performance Interconnects, P.P. 31-5,2001" and "Nikkei Electronics No. 810, Dec. 3, 2001, pp. 121-122". Specifically, it is proposed that signals are transmitted only within an interposer of an LSI package without using a mounting board so as to shorten the electrical wiring as much as possible, and the electric signal is converted into an optical signal on the interposer for receiving the signals from the external device or for transmitting the signals to the external device.

Each of the publications quoted above discloses the configuration that an optical interface module is fixed by welding to the interposer of the LSI, and the interposer of the LSI is optically connected to the optical interface module by a fiber comprising an optical connector.

In this configuration, the LSI for the signal processing is electrically connected to the interposer by a solder bump. An optical interface module is mounted to the interposer by a solder bump. The input-output terminals of the LSI are connected to a wiring, and the wiring is connected to the optical interface module. An interface IC and an optical element are housed in the optical interface module, and the electric signal is converted into an optical signal by the interface IC and the optical element. The interface IC and the optical element are housed in a package provided with an input-output window for the optical signal so as to ensure the reliability as the optical interface module.

A flat micro-lens plate is mounted to the input-output window so as to permit the light beam incident on the optical interface module and the light beam emitted from the optical interface module to be converged by the micro lens. The micro lens imparts a big tolerance relative to the optical coupling with the optical fiber mounted on the outside. The interposer is electrically connected to the solder bump by the mounting board. One end of the optical fiber is connected to an optical connector comprising a mirror for changing the optical path by 90°. An aligning pin mounted to the optical connector is inserted into a coupling hole of the package so as to determine the positions of the optical connector and the package so as to permit the micro lens and the optical fiber to be aligned.

According to the configuration described above, the optical interface module is mounted to the interposer after the interface IC, the optical element, etc. have been packaged. Therefore, the optical interface modules are individually inspected so as to make it possible to mount a good optical interface alone having a high reliability, thereby suppressing the inspection cost. Also, since the optical connector is connected after the interposer is mounted to the mounting board, advantages in the manufacturing process can be obtained. For example, it is unnecessary to take into consideration the deterioration of the resin cover caused by the heat treatment in the mounting stage of the interposer and other parts. It is also unnecessary to consider the limitation in the handling of the optical fiber such as the bending leading to the breakage.

However, the particular configuration requires the soldering of the LSI to the interposer, the soldering of the optical interface module to the interposer, or the soldering of the interposer to the mounting board. It should be noted in this connection that the LSI package must be assembled by changing the melting points of the solders such that a certain soldering does not cause a defect in the other soldering. Also, the mounting procedure is limited in assembling the parts of the LSI package. Further, in order to hold the optical connector, required is a mechanism for pushing the optical connector to the package so as to hold the optical connector, and the mechanism of the apparatus tends to be rendered bulky in the case where the optical connection is achieved by using a connector. Still further, if a holding mechanism is mounted to the apparatus, the space in which is arranged a heat sink mounted to an upper portion of the LSI is limited so as to render complex the configuration and to increase the cost. It follows that it is difficult to mount the heat dissipating heat sink of the optical interface module.

In general, the power consumption per terminal tends to be increased with increase in the transfer frequency of the signal. For example, the power consumption of some of the LSIs has come to reach 70 to 80 W in recent years in the CPU used in a personal computer. Therefore, the apparatus is constructed such that a heat spreader and a gigantic heat sink are mounted on the signal processing LSI so as to ensure a large heat dissipating area, and a compulsory air cooling is performed by using, for example, a fan. On the other hand, it is necessary to decrease the wiring length between the signal processing LSI and the interface module as much as possible as described previously. Therefore, in the case of mounting a heat sink for the signal processing LSI, there is no allowance in the space for mounting another heat sink for the interface module.

Under the circumstances, it is conceivable to mount a heat sink shared by the signal processing LSI and the interface module so as to achieve the heat dissipation simultaneously from the signal processing LSI and the interface module. However, where the signal processing LSI and the interface module are mounted simultaneously to the interposer 2, it is difficult to align strictly the upper surfaces of the signal processing LSI and the interface module and to set the difference in level strictly at a prescribed value.

What should also be noted is that, since the interface module is soldered, it is also necessary to renew the expensive signal processing LSI in the event of the disorder of the interface module.

The configuration that an optical element is mounted directly to the interposer 2 and an optical waveguide made of an organic material is attached to the mounting board so as to form a transmission line is disclosed in "16$^{th}$ Academic Lecture Meeting of Electronics Mounting, 20B-10, 2002".

In the particular configuration, an interface IC is soldered to the interposer. The interposer is fixed to a mounting board with a spacer interposed therebetween. The mounting board and the interposer are connected to each other by, for example, a flexible wiring, and a power source, an input-output electric signal, etc. are supplied to the mounting board and the interposer. In this configuration, it is assumed that the signal processing LSI, etc. are mounted in the three dimensional direction above the interface IC.

A surface-emitting type optical element is mounted to the interposer on the side of the mounting board, and the positions of an optical waveguide and an optical element are determined to permit the optical element to be optically coupled with the optical waveguide including a mirror mounted to the mounting board for changing the optical path by 90°. Also, an electrode is mounted to extend through the interposer so as to decrease the length of the wiring for the electric signal, thereby obtaining good signal characteristics.

In the particular configuration, the optical element as a bare chip is mounted directly to the interposer. When the interposer is mounted to the mounting board, the optical element is optically coupled with the optical waveguide. It follows that it is difficult to maintain an optical accuracy because of the difference in the thermal expansion coefficient between the mounting board and the interposer. Also, if the optical element is mounted as a bare chip, it is difficult to ensure the reliability of the optical element. In order to ensure the reliability, it is necessary for the optical element portion to be buried in, for example, the resin transparent to the wavelength used for the signal transmission so as to require a processing operation on the mounting board. It follows that much limitation is imposed on the manufacturing process so as to increase the manufacturing cost. Further, since it is necessary to attach separately the optical waveguide to the mounting board, the mounting process is rendered complex so as to increase the mounting cost. An additional problem to be noted is that, in the particular configuration, it is necessary to renew the optical element together with the expensive signal processing LSI in the event of the disorder of the optical element.

The problems described above in conjunction with the prior art using an optical fiber as a transmission line are also brought about in the case of using an electrical transmission line such as a coaxial cable, a semi-rigid cable or a flexible wiring board.

As described above, various optical interface modules are used for improving the throughput of the conventional interface. However, the board edge mounting type optical interface module disclosed in "Proceedings. 51$^{st}$ Electronic Components and Technology Conference, P.P. 880-5,2001" gives rise to the problem that a costly transmission line is required for transmitting signals having a high frequency so as to increase the cost of the mounting board.

Also, the configuration disclosed in "HOT9 Interconnects. Symposium on High Performance Interconnects, P.P. 31-5, 2001" and "Nikkei Electronics No. 810, Dec. 3, 2001, pp/121-122" gives rise to the problems in the mounting that the mechanism is rendered excessively bulky because a connector system is employed in the configuration, and that careful attentions are required for the soldering. Further, the configuration is rendered complex because it is necessary to ensure the space for mounting a heat sink so as to give rise to the problems that the manufacturing cost is increased and that it is difficult to mount a heat sink for the heat dissipation from the optical interface module. Where the heat sink is shared by the signal processing LSI and the interface module, it is difficult to allow the upper surfaces of the signal processing LSI and the interface module to be aligned strictly and to control the difference in level at a prescribed value strictly in mounting simultaneously the LSI and the interface module to the interposer. Further, since the interface module is soldered, it is also necessary to renew the expensive signal processing LSI in the event of the disorder of the interface module.

Further, the configuration disclosed in "16th Academic Lecture Meeting of Electronics Mounting, 20B-10, 2002" gives rise to the problem that it is difficult to maintain an optical accuracy because of the difference in the thermal expansion coefficient between the mounting board and the interposer. Further, since it is necessary to mount separately an optical waveguide to the mounting board, the mounting process is rendered complex so as to increase the mounting cost. In addition, in the event of the disorder of the optical element, it is necessary to renew the expensive signal processing LSI in the event of the disorder of the optical element.

The problems similar to those described above are also brought about in the configuration in which is used an electric interface module that does not involve an optical element.

BRIEF SUMMARY OF THE INVENTION

An object of the present invention is to provide an LSI package provided with an interface module, which permits mounting an interface module without requiring an expensive transmission line.

According to an aspect of the present invention, there is provided a LSI package arranged on a mounting board, comprising:

a LSI configured to process signals, the LSI having signal input and output terminals;

an interposer configured to mount the LSI, and including first signal terminals electrically connected to the signal input and output terminals of the LSI, second electric terminals for electrically connecting the LSI to the mounting board, internal wirings electrically connected to the first signal terminals, and first coupling parts electrically connected to the internal wirings; and an interface module including signal transmission lines configured to transmit the signals to outside and to receive the signals from outside and second coupling parts electrically connected to the transmission line, the second coupling parts being electrically connected to the first coupling parts by means of mechanical contact, respectively.

According to another aspect of the present invention, there is provided a LSI package arranged on a mounting board, comprising:

a LSI configured to process signals, the LSI having signal input and output terminals;

an interposer configured to mount the LSI, and including first signal terminals electrically connected to the signal input and output terminals of the LSI, second electric terminals for electrically connecting the LSI to the mounting board, internal wirings electrically connected to the first signal terminals, and first coupling parts electrically connected to the internal wirings; and an interface module including signal transmission lines configured to transmit the signals to outside and to receive the signals from outside and second coupling parts electrically connected to the transmission line, the second coupling parts being electrically connected to the first coupling parts, the first or second or both coupling parts being provided with a mechanism of adjusting the gap height between the interface module and the interposer.

According to yet another aspect of the present invention, there is provided a method of assembling a LSI package on a mounting board, comprising:

providing an interposer configured to mount a LSI configured to process signals, the LSI having signal input and output terminals, the interposer including first signal terminals electrically connected to the signal input and output terminals of the LSI, second electric terminals, internal wirings electrically connected to the first signal terminals, and first coupling parts electrically connected to the internal wirings;

mounting the interposer to a mounting board, and electrically connecting the LSI to the mounting board through the second electric terminals; and providing an interface module including a signal transmission line configured to transmit the signals and second coupling parts electrically connected to the transmission line; and aligning the second coupling parts to the first coupling parts, mounting the interface module to the mounting board, and electrically and mechanically connecting the second coupling parts to the first coupling parts, respectively.

BRIEF DESCRIPTION OF THE SEVERAL VIEWS OF THE DRAWING

FIGS. 21A, 21B and 21C are cross sectional views showing in a magnified fashion a part of the connecting process of the connecting structure between the optical interface module and the interposer shown in FIG. 20;

DETAILED DESCRIPTION OF THE INVENTION

Some embodiments relating to an LSI package comprising a high-speed optical interface module of the present invention will now be described with reference to the accompanying drawings.

First Embodiment

Figure 1:
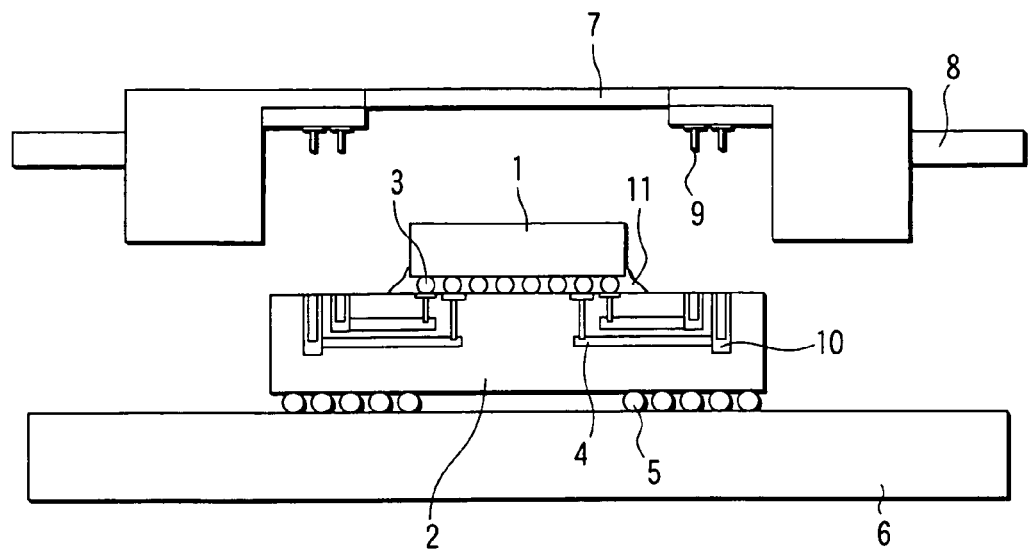
FIG. 1 is a cross sectional view, partly broken away, schematically showing the configuration of an LSI package comprising a high-speed interface module according to a first embodiment of the present invention.

FIG. 1 is a cross sectional view schematically showing the configuration of an LSI package, comprising a high-speed interface module according to a first embodiment of the present invention before the state that an optical interface module is connected to the LSI package. On the other hand, FIG. 2 is a cross sectional view schematically showing the configuration of the LSI package shown in FIG. 1 and having an optical interface module connected thereto.

Figure 2:
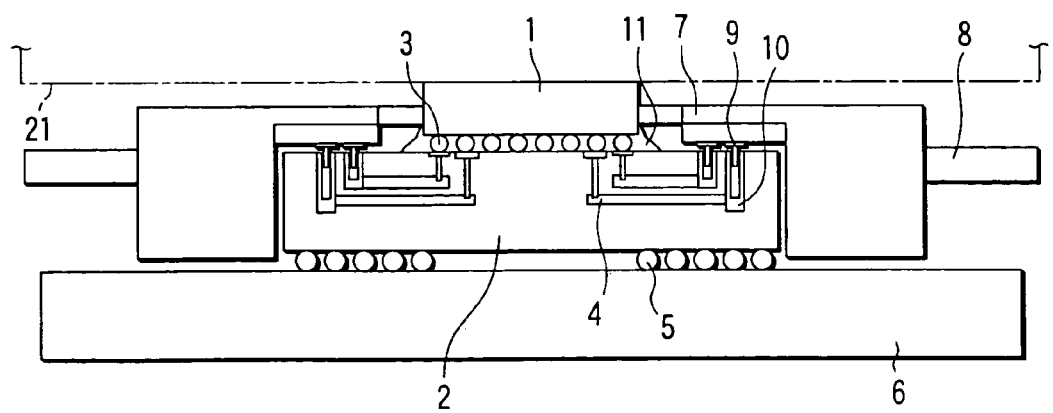
FIG. 2 is a cross sectional view schematically showing the assembled structure of the LSI package shown in FIG. 1.

In FIGS. 1 and 2, a reference numeral 1 denotes a signal processing LSI. As shown in the drawing, the LSI 1 includes signal input and output terminals that are electrically connected to an interposer 2 by solder bumps 3. An under-fill resin 11 seals the connecting portions of the solder bumps 3. A high-speed signal wiring 4 capable of transmitting signals at a high-speed is arranged within the interposer 2. Pads are formed at one ends of the wiring 4, and the pads are connected to the solder bumps 3 having the signal input-output terminals of the LSI 1 connected thereto. The high-speed signal wiring 4 is connected at the other ends to a jack structure, i.e., electric connection terminals 10, mounted on the side of the front surface of the interposer 2.

As shown in FIGS. 1 and 2, an optical interface module 7 is arranged on the LSI 1 and the interposer 2. The module 7 includes, for example, an interface IC, an optical element, and an optical fiber 8. Within the optical interface module 7, an obliquely polished optical fiber is arranged stationary in an upper portion of the active region of the optical element such that the light beam emitted from the optical element is introduced into the optical fiber, and the light beam emitted from the optical fiber is introduced into the optical element. By the particular arrangement, the optical element and the optical fiber are optically connected to each other. Also, connecting pins, i.e., electric connecting terminals 9, of the optical interface module 7 are inserted into the jack structure 10 so as to be fixed. Also, a power source, a ground line, or a low-speed control signal line, are similarly connected to the LSI 1 via the wiring of the interposer 2. The interposer 2 is connected to an electric wiring on a mounting board 6 by a solder bump 5.

According to the configuration described above, the interposer 2 is mounted to the mounting board 6 as shown in FIG. 1 by the process substantially equal to that in the mounting of the ordinary BGA (Ball Grid Array) package LSI and, then, the optical interface module 7 is connected mechanically and electrically to the interposer 2 as shown in FIG. 2. In other words, the optical interface module 7 can be mounted to the interposer 2 after the interposer 2 is electrically mounted together with the other members to the mounting board 6, i.e., after the heat treatment such as a re-flow or AH laser heating. The particular configuration has a high affinity with the electric mounting.

In the configuration shown in FIGS. 1 and 2, the optical interface module 7 is individually packaged. Therefore, it is possible to improve the reliability of the optical interface module 7. Further, it is possible to inspect the optical interface module 7 itself so as to suppress the decrease in the yield of the mounting board 6 caused by the defective optical element. Still further, since the optical interface module 7 can be mounted by the electrical mounting without employing a heat treatment, the limitation of the mounting accompanying the employment of the pigtail system can be suppressed. What should also be noted is that, since the high-speed signal is not transmitted through the wiring of the mounting board 6 and is transmitted from the interposer 2 to the optical interface module 7 via the connecting pins 9, the transmitting distance is shortened and, thus, a high frequency signal can be transmitted.

Further, in the configuration shown in FIGS. 1 and 2, digital signals can be transmitted between the signal processing LSI 1 and the interface IC housed in the optical interface module 7. Also, analog electric signals are supplied into and transmitted from the optical element housed in the optical interface module 7. The analog electric signals are transmitted over a very short distance. It follows that, in transmitting a high frequency signal not lower than 10 Gbps, it is possible to form a wiring having a high resistance to noise. As a result, it is possible to ensure a wide design margin of the interposer 2 so as to effectively lower the manufacturing cost of the entire apparatus. It should be noted that a high-speed signal line need not be formed in the mounting board 6 and, thus, the design of the mounting board 6 can be much facilitated. Also, a cheap material such as the ordinary FR4 can be used for forming the mounting board 6. Further, the reduction in the cost of the entire system can be facilitated.

Also, in place of the configuration that the optical fiber 8 is connected by using a connector, the optical interface module 7 is connected directly to the interposer 2 so as to make it possible to miniaturize the optical interface module 7. Further, since the optical fiber 8 is inserted in a lateral direction, the thickness of the optical interface module 7 can be further decreased. It follows that the height of the upper surface of the optical interface module 7 relative to the interposer 2 can be made smaller than that of the LSI 1 so as to ensure a large installing space of a heat sink 21 for the LSI 1.

Figure 3:
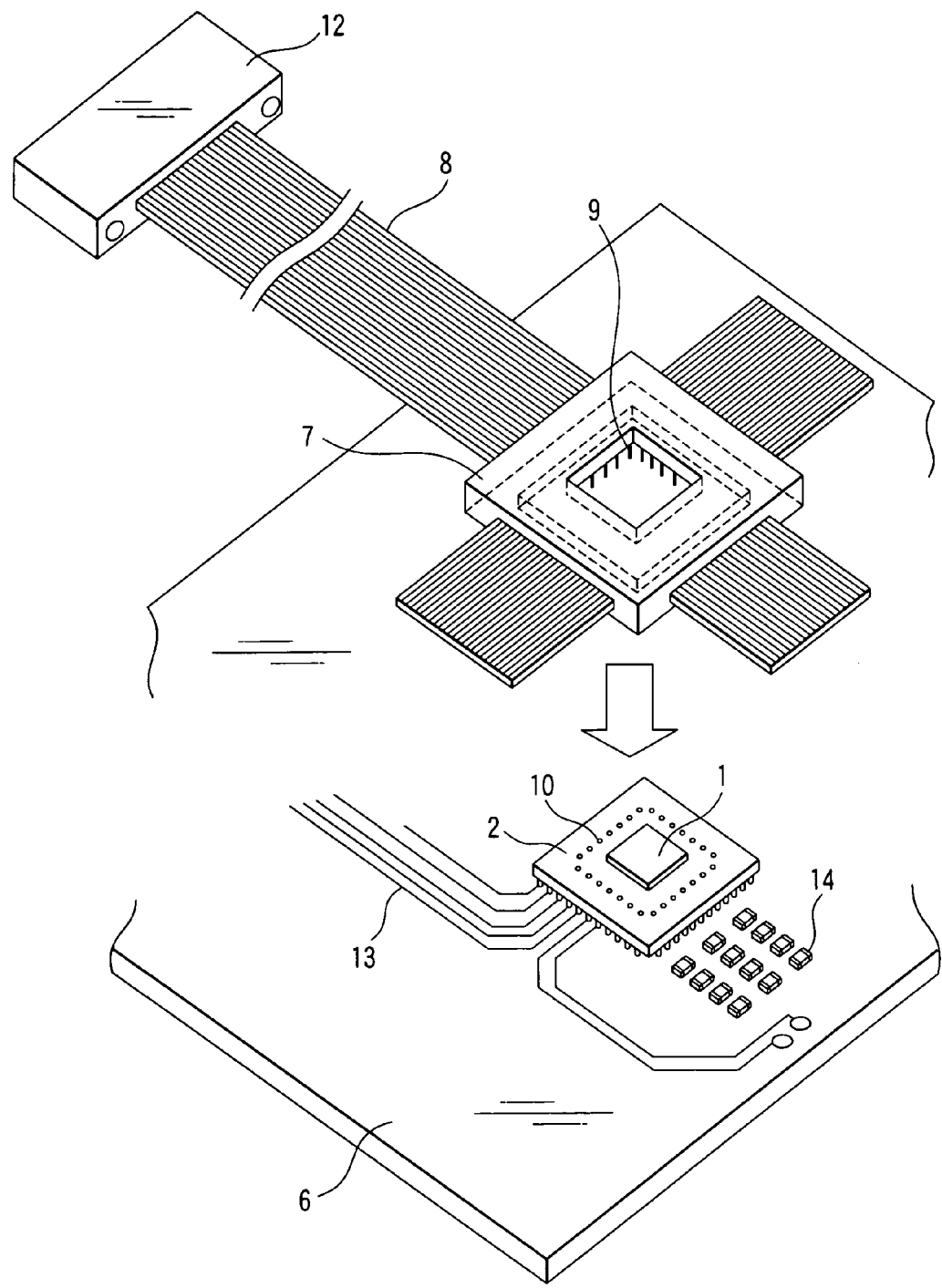
FIG. 3 is an oblique view showing the actually mounted state of the LSI package shown in FIG. 1.

FIG. 3 is an oblique view showing the actual mounting state of an LSI package comprising a high-speed interface module according to the first embodiment of the present invention.

The interposer 2 having the signal processing LSI 1 mounted thereto together with the other mounting parts is mounted to the mounting board 6. Then, the connecting pins 9 of the optical interface module 7 are inserted into the jack structure 10 of the interposer 2 as denoted by an arrow in the drawing so as to finish preparation of the package. In FIG. 3, a reference numeral 13 denotes the wiring on the mounting board 6, and a reference numeral 14 denotes the chip part on the mounting board 6. Also, an optical connector 12 for connection to the optical fiber outside the apparatus is connected to the optical fiber 8 extending from the optical interface module 7.

As described above, the optical connector 12 is arranged apart from the optical interface module 7, and the external optical fiber is connected to the optical connector 12. It follows that the optical connector structure referred to previously is enlarged so as to eliminate the limitation on the mounting. Also, the electrical connection between the optical interface module 7 and the interposer 2 is achieved by the connecting pins 9 and the jack structure 10 as shown in FIGS. 2 and 3. These pins and jack structure are connected to each other on the four sides around the signal processing LSI 1. It follows that the force applied to the connecting pins 9 during the connection can be uniformly dispersed. As a result, it is possible to suppress the inconveniences that the force is concentrated on a specific pin so as to break the pin, and that a non-uniform force is applied to the interposer 2 so as to break the soldered portion.

Also, an electrical mounting can be performed by subjecting the interposer 2 having the signal processing LSI 1 mounted thereto to the soldering together with the other mounting parts such as the chip parts like a capacitor and a reactance, the peripheral LSI or IC by the ordinary re-flow process or by the coupling with a socket. After completion of the mounting, the interface module 7 can be mounted later to the interposer 2 by the mechanical connection alone without imparting a thermal history to the interface module 7. It follows that the transmission line used in the interface module 7 can be selected without being limited by the mounting process. As a result, it is possible to select the optimum materials conforming with the transmitting distance, the frequency or the cost so as to lower the entire cost of the apparatus.

Second Embodiment

Figure 4:
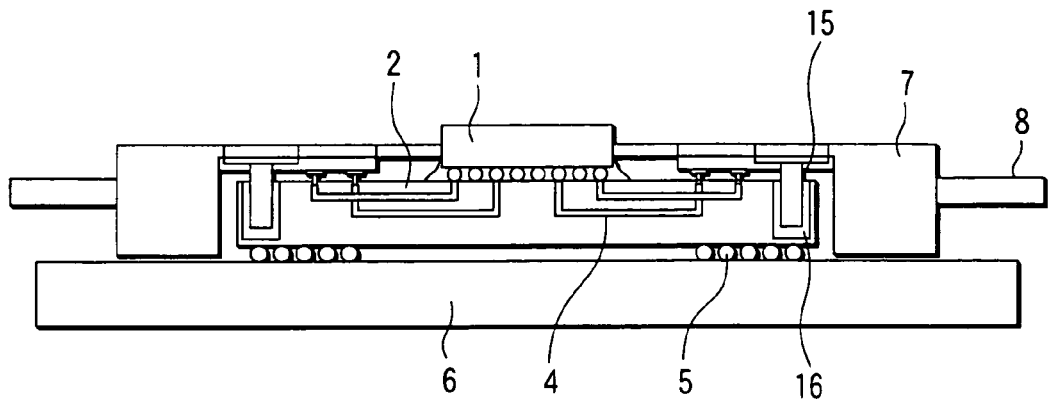
FIG. 4 is a cross sectional view schematically showing the configuration of an LSI package comprising a high-speed interface module according to a second embodiment of the present invention.

FIG. 4 is a cross sectional view schematically showing the configuration of an LSI package comprising a high-speed interface module according to a second embodiment of the present invention. Incidentally, the members of the package shown in FIG. 4, which are equal to those shown in FIG. 1, are denoted by the same reference numerals so as to omit the detailed description thereof.

Where the number of signal lines is increased for increasing the band of the signals in the configuration of the first embodiment, it is necessary to modify the connector of the optical interface module 7. Specifically, it is necessary to decrease the pitch of the connecting pins 9 as a fine structure. In this case, a high accuracy is required in the positioning of the connecting pins 9 and the jack structures 10 when the connecting pins 9 are connected to the jack structures 10.

Under the circumstances, guide pins 15 for the position alignment are formed in the optical interface module 7 and guide holes 16 having the guide pins 15 inserted thereinto are formed in the interposer 2 in the second embodiment of the present invention, as shown in FIG. 4.

The particular configuration for the second embodiment makes it possible to realize a high aligning accuracy between the connecting pins 9 and the jack structure 10 when the connecting pins 9 are connected to the jack structure 10 by simply inserting the guide pin 15 into the guide hole 16. It follows that it is possible to obtain the effect similar to that obtained in the first embodiment. In addition, it is possible to cope sufficiently with the case where the pitch of the connectors of the optical interface module 7 is decreased as a fine structure.

Third Embodiment

Figure 5:
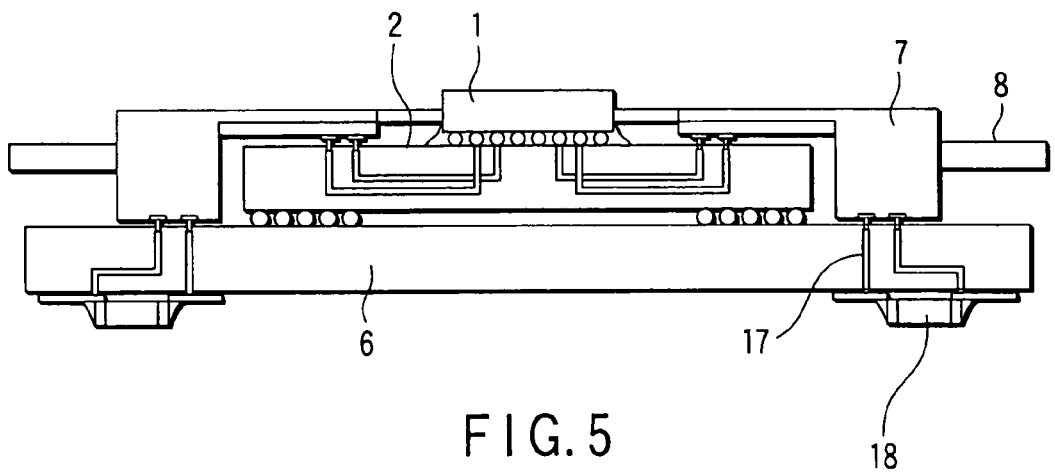
FIG. 5 is a cross sectional view schematically showing the configuration of an LSI package comprising a high-speed interface module according to a third embodiment of the present invention.

FIG. 5 is a cross sectional view schematically showing the configuration of an LSI package comprising a high-speed interface module according to a third embodiment of the present invention. Incidentally, the members of the package shown in FIG. 5, which are equal to those shown in FIG. 1, are denoted by the same reference numerals so as to omit the detailed description thereof.

If the power source and the ground line of the optical interface module 7 are shared by the signal processing LSI 1 in the configuration for the first embodiment, the switching noises of the module 7 and the LSI 1 are assumed to interfere with each other so as to generate a signal noise. For avoiding the problem, it is necessary to perform the de-coupling by using, for example, a capacitance in the region very close to the power source line of each of the signal processing LSI 1 and the optical interface module 7 on the interposer 2. However, the size of the free space on the interposer 2 is limited, failing to provide a sufficient allowance that permits mounting the additional chip part required by the mounting of the optical interface module 7.

Under the circumstances, the power source and the ground line for the optical interface module 7 are taken directly from a power source wiring 17 of the mounting board 6, and the de-coupling is performed by, for example, a capacitance chip or a noise filter chip 18 on the rear surface of the mounting board 6 in the third embodiment of the present invention as shown in FIG. 5. In the third embodiment, the connection between the mounting board 6 and the optical interface module 7 is performed by the pin-jack structure mechanism as in the connection of the interposer 2.

The particular configuration described above makes it possible to dispose the additional chip part required by the addition of the optical interface module 7 on the mounting board 6. It follows that it is possible to obtain the effect similar to that obtained in the first embodiment. In addition, since the limitation of the size is moderated, it is possible to apply a stronger de-coupling even if a large change is not made on the side of the interposer 2.

Fourth Embodiment

In each of the first to third embodiments described above, the signal processing LSI and the electrical connection terminals are arranged on the surface of the interposer 2. However, it is also possible to arrange the signal processing LSI and the electrical connection terminals as shown in FIGS. 6 and 7.

Figure 6:
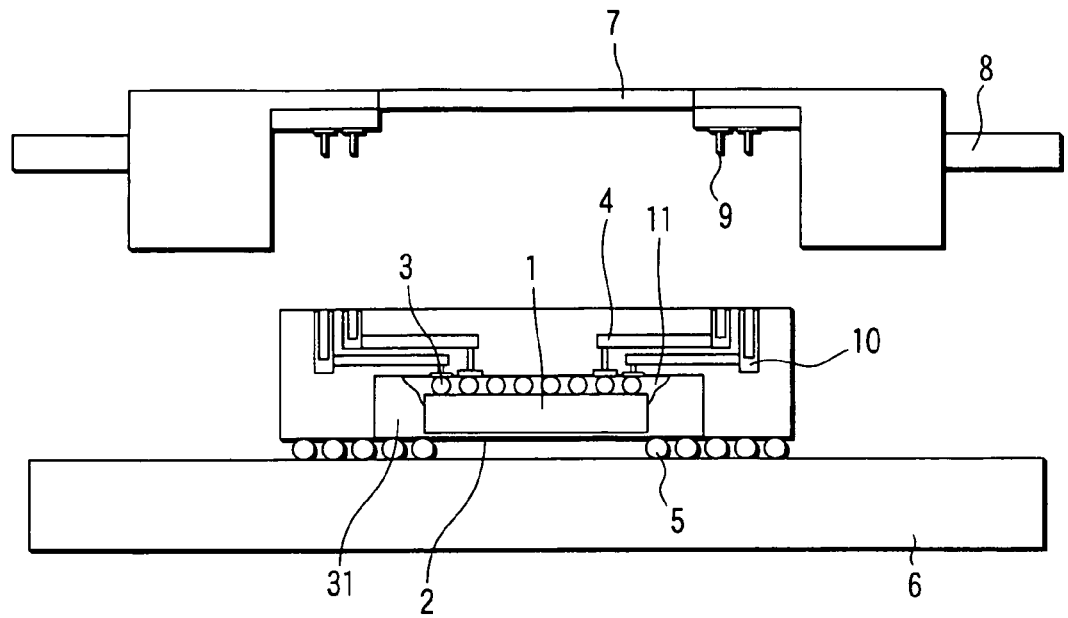
FIG. 6 is a cross sectional view schematically showing the configuration of an LSI package comprising a high-speed interface module according to a fourth embodiment of the present invention.
Figure 7:
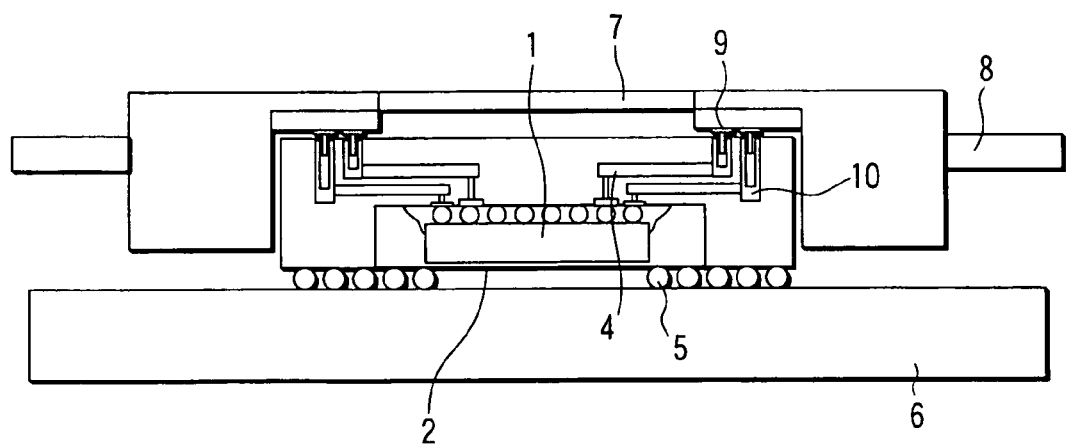
FIG. 7 is a cross sectional view schematically showing the assembled structure of the LSI package shown in FIG. 6.

FIG. 6 is a cross sectional view showing the state before the optical interface module is connected to the interposer 2, and FIG. 7 is a cross sectional view showing the state after the optical interface module is connected to the interposer 2.

In the configuration shown in FIGS. 6 and 7, the signal processing LSI is housed in a cavity 31 within the interposer 2. To be more specific, the signal processing LSI 1 is housed and arranged in a lower portion of the interposer 2. A pin.jack structure 10 is formed in an outer circumferential region in an upper portion of the interposer 2. The pin.jack structure 10 is connected to the wiring within the interposer 2. Further, the wiring lines are connected to the signal input and output terminals of the LSI 1 through the solder bump 3. As shown in FIG. 6, the optical interface module 7 is aligned on the interposer 2. Then, the optical interface module 7 is fixed on the interposer 2 as shown in FIG. 7. It follows that the signal processing LSI is not exposed to the outside of the package and, thus, the particular configuration is excellent in the handling capability and the reliability.

Fifth Embodiment

Figure 8:
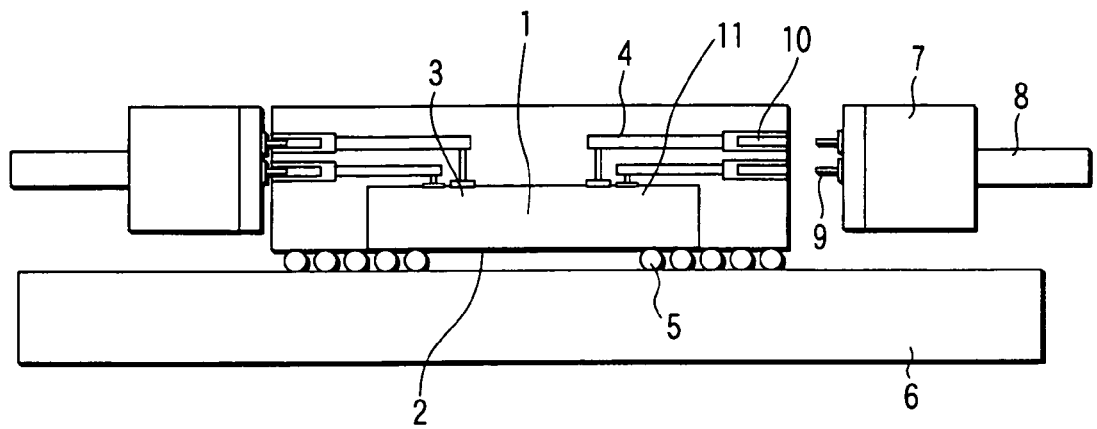
FIG. 8 is a cross sectional view schematically showing an LSI package comprising a high-speed interface module according to a fifth embodiment of the present invention during the assembling process.
Figure 9:
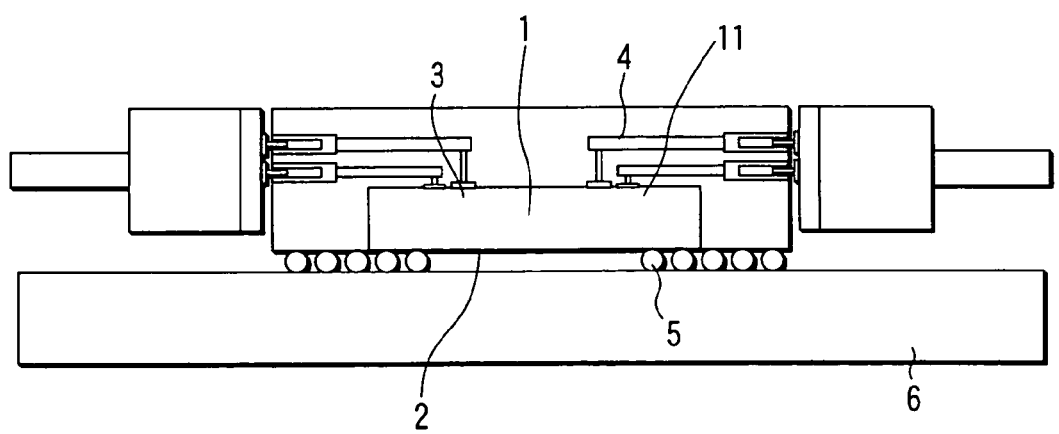
FIG. 9 is a cross sectional view schematically showing the LSI package comprising a high-speed interface module shown in FIG. 8.

FIG. 8 is a cross sectional view showing the state before the optical interface module 7 is connected to the interposer 2, and FIG. 9 is a cross sectional view showing the state after the optical interface module 7 is connected to the interposer 2.

In the configuration shown in FIGS. 8 and 9, the electrical connection terminal 10 is arranged on the side surface of the interposer 2. Also, the optical interface module 7 is arranged sideward of the interposer 2 so as to be connected and fixed to the interposer 2. It follows that, in the configuration shown in FIGS. 8 and 9, the thickness of the entire apparatus is decreased so as to make it possible to miniaturize the apparatus.

Sixth Embodiment

Figure 10:
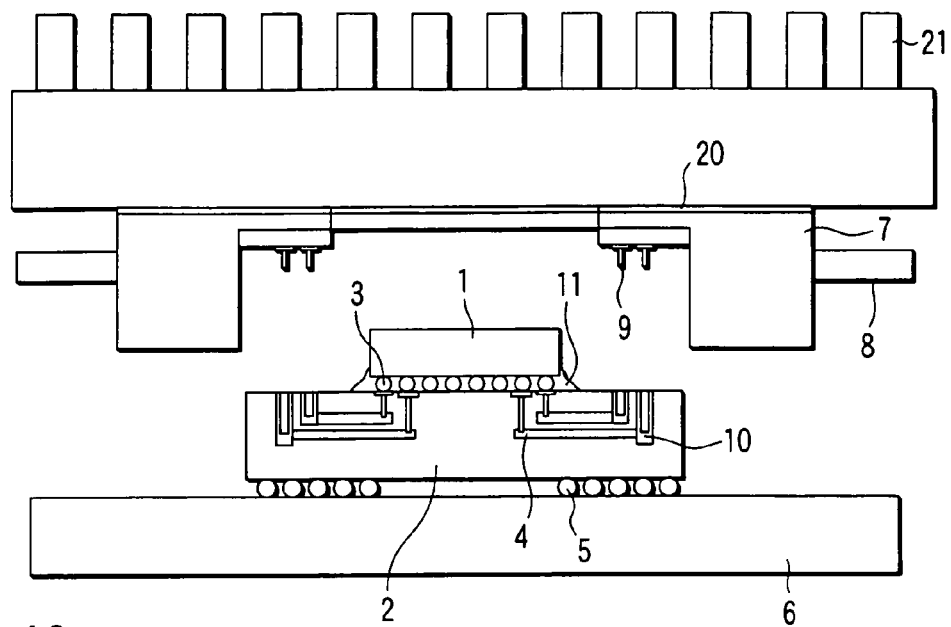
FIG. 10 is a cross sectional view schematically showing an LSI package comprising a high-speed interface module according to a sixth embodiment of the present invention during the assembling process.
Figure 11:
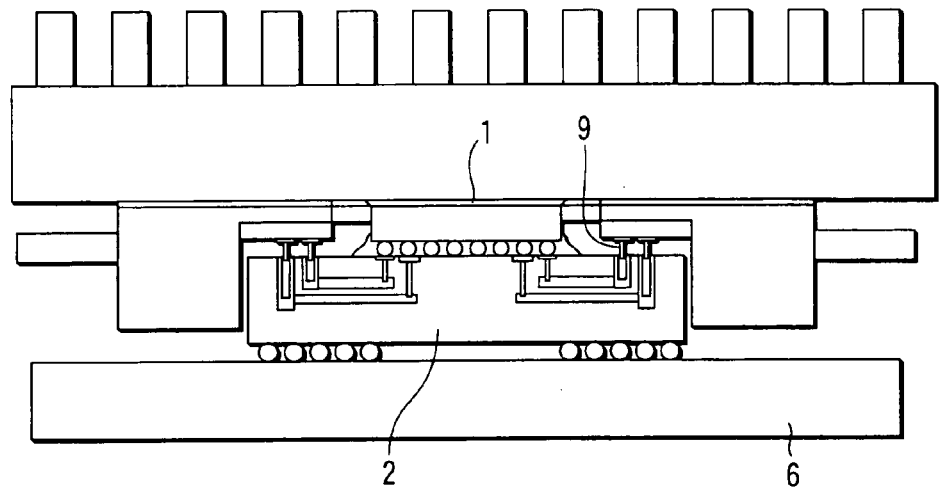
FIG. 11 is a cross sectional view schematically showing the assembled structure of the LSI package shown in FIG. 10.
Figure 12:
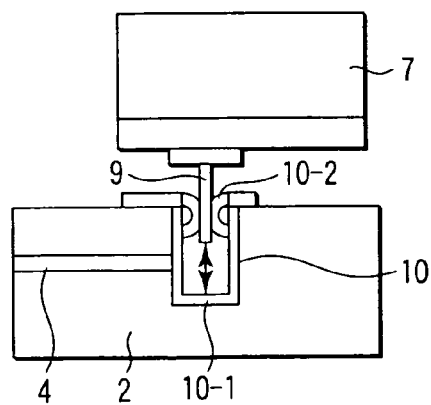
FIG. 12 is a cross sectional view showing in a magnified fashion a part of the connecting structure between the optical interface module and the interposer shown in FIG. 11.
Figure 13:
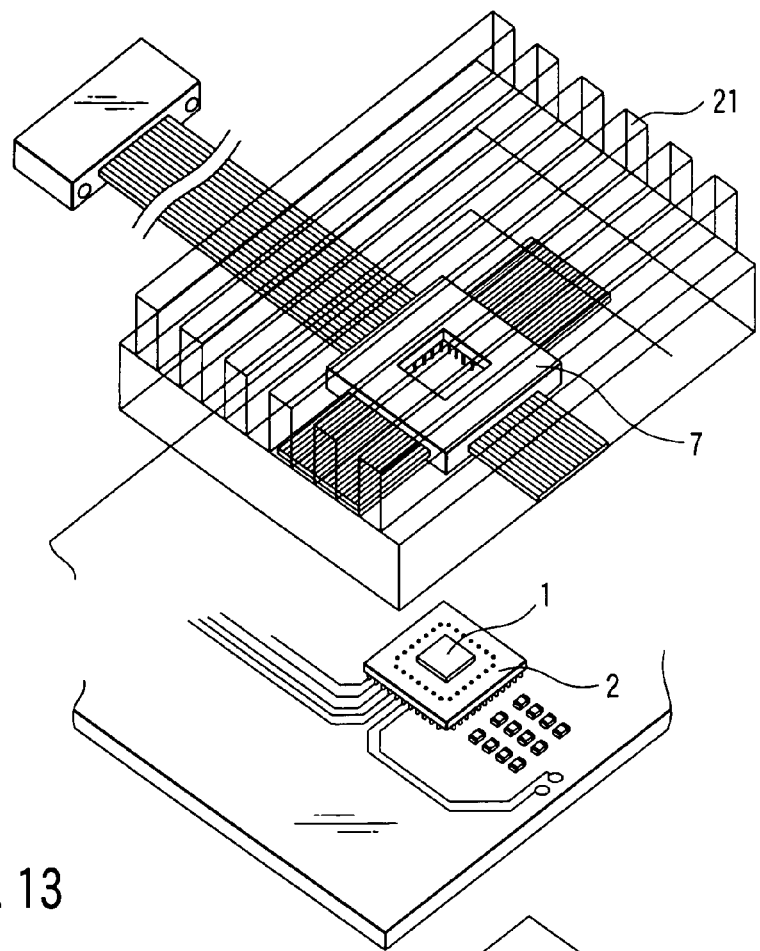
FIG. 13 is an oblique view schematically showing in a dismantled fashion the LSI package according to the sixth embodiment of the present invention.
Figure 14:
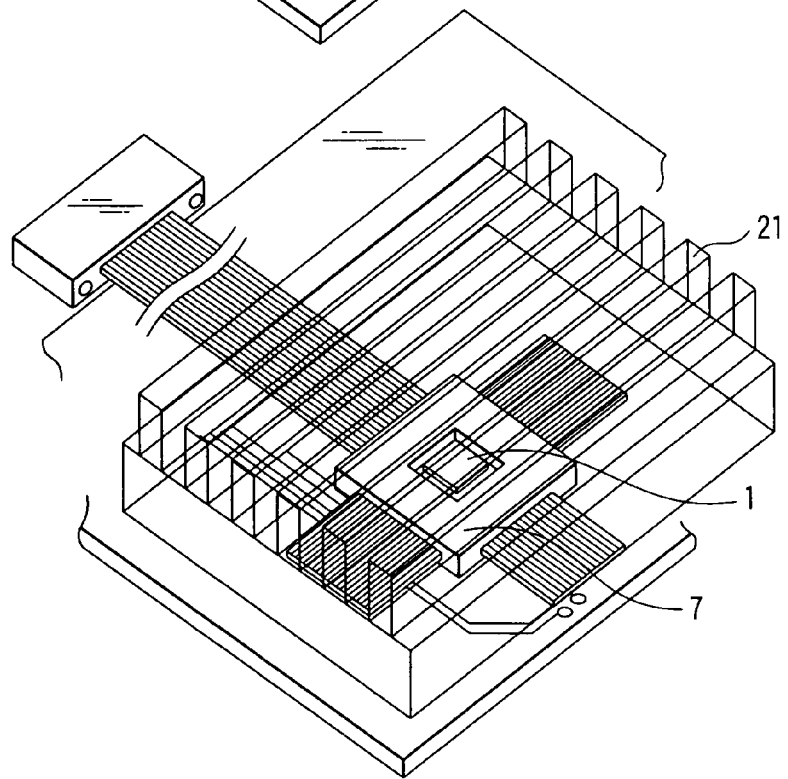
FIG. 14 is an oblique view schematically showing the assembled structure of the LSI package shown in FIG. 13.

FIGS. 10 and 11 are directed to an LSI package comprising a high-speed interface module according to a sixth embodiment of the present invention, wherein FIG. 10 is a cross sectional view showing the state before the optical interface module is connected to the interposer 2, and FIG. 11 is a cross sectional view showing the state after the optical interface module is connected to the interposer 2. FIG. 12 is a cross sectional view showing the configuration of the electrical connecting portion shown in FIG. 11. FIG. 13 is an oblique view showing in a perspective fashion the LSI package shown in FIG. 10. Further, FIG. 14 is an oblique view showing in a perspective fashion the LSI package shown in FIG. 12. Incidentally, the members of the package shown in FIGS. 10 to 14, which are equal to those shown in FIG. 1, are denoted by the same reference numerals so as to omit the detailed description thereof.

As shown in FIG. 10, a heat sink 21 is formed on an upper surface of the optical interface module 7. The heat sink 21 is fixed to the upper surface of the optical interface module 7 by a heat conductive adhesive layer 20 having a suitable thickness. The interposer 2 having the signal processing LSI 1 mounted thereto is soldered to the mounting board 6 by the solder bump 5. Also, the signal processing LSI 1 is attached to the heat sink 21 having the optical interface module 7 mounted thereto via a heat conductive paste material layer 19 having a suitable thickness and formed on the upper surface of the signal processing LSI 1. In attaching the LSI 1, the connecting pins 9 are inserted into the jack structures 10 on the interposer 2 for the electrical connection as shown in FIG. 12.

As shown in FIG. 12, the jack structure 10 includes, for example, a conductor 10-1 connected to a high-speed signal wiring 4 formed on the inner surface of a coupling hole formed in the interposer 2 and a flexible conductive spring 10-2 electrically connected to the conductor 10-1. The spring 10-2 permits the conductor 10-1 to be kept in an electrical contact with the connecting pins 9, and the configuration having an allowance between the tip of the connecting pins 9 and the bottom of the coupling hole is formed in the interposer 2. In the particular configuration, the connecting pins 9 are capable of being displaced in the up-down direction while maintaining an electrical connection to the jack structure 10. The range of displacement of the connecting pins 9, which are dependent on the length of the connecting pins 9 and the depth of the coupling hole, is about several hundred microns.

According to the particular configuration, it is possible to attach the heat sink 21 to the rear surface of the signal processing LSI 1 with the heat conductive paste material layer 19 having an appropriate thickness interposed therebetween as shown in FIGS. 11 and 14 after the optical interface module 7 is fixed to the heat sink 21 with the heat conductive adhesive layer 20 having a suitable thickness as shown in FIGS. 10 and 13. As a result, it is possible to set the thickness of each of the signal processing LSI 1 and the optical interface module 7 at a suitable value so as to suppress the elevation of the thermal resistance. In addition, it is possible to maintain the electrical connection between the LSI and the optical interface module. Also, it is possible to use a heat conductive sheet that does not exhibit fluidity in place of the heat conductive paste layer 19 so as to facilitate the control of the thickness by the pressurization.

It is conceivable to solder the optical interface module 7 to the interposer 2. However, the soldering is not desirable. It should be noted in this connection that, in the soldering structure, both the signal processing LSI 1 and the optical interface module 7 are bonded to the heat sink 21 by using a heat conductive adhesive. In this configuration, however, there may be produced a deviation in the level derived from the difference in the thickness between the LSI 1 and the optical interface module 7. If the thickness of the heat conductive adhesive layer is adequately set, the LSI 1 and the optical interface module 7 are arranged in substantially same level and the deviation in the level can be cancelled.

The heat conductivity of the heat conductive adhesive is about 30 to 60 W/m/K, which is lower than 240 W/m/K for aluminum widely used in a heat sink material and 150 W/m/K for silicon used as the LSI material. It follows that, in view of the heat dissipation, it is advantageous for the heat conductive adhesive layer to be thin. However, with decrease in the thickness of the heat conductive adhesive layer, the bonding strength is lowered and, at the same time, the crack generation tends to be caused. Where the LSI is thin, the heat conductive adhesive layer is rendered thick on the side of the LSI and, where the LSI is thick, the adhesive layer is rendered thick on the side of the optical interface module. In this fashion, it is difficult to allow the heat conductive adhesive layer to have an appropriate thickness on both sides simultaneously. In other words, since the difference in level is absorbed by the thickness of the adhesive layer, the adhesive layer is required to include a thick portion, leading to the problem that the thermal resistance of the adhesive layer in the thick portion is increased so as to lower the heat dissipating capability.

On the other hand, in the configuration shown in FIGS. 10 to 12, the height can be adjusted by using the connecting pins 9 and the jack structure 10, and the difference in level between the signal processing LSI 1 and the optical interface module 7 can be absorbed by the height adjusting mechanism so as to overcome the problem accompanying the generation of the difference in level.

Also, in the configuration shown in FIGS. 10 to 12, the electrical connecting portions of the optical interface module 7 are arranged on the four sides around the signal processing LSI 1 as shown in FIGS. 13 and 14 so as to make uniform the force applied to the connecting portions in the connecting stage. Therefore, when the heat conductive paste layer 19 is pushed against the rear surface of the signal processing LSI 1, the pushing force can be applied uniformly, with the result that the thickness of the heat conductive paste layer can be made uniform easily so as to produce the effect of suppressing the planar distribution of the thickness. The pressure can be made uniform similarly in the case of using a heat conductive sheet so as to suppress the elevation of the thermal resistance caused by the partial pressurization. Also, it is possible to suppress the defect that the force is concentrated on a specific pin so as to apply a non-uniform force to the interposer 2, thereby breaking the soldered portion for mounting the board.

The configuration producing the particular effect is not limited to the configuration for the connection on four sides. The similar effect can also be produced from, for example, the configuration for the connection on two sides. Also, since all the electrical connection terminals are not necessarily connected electrically, it is possible for the optical fiber to be present on, for example, one side alone such that the corresponding terminal alone is electrically connected to the optical fiber, with dummy terminals for mechanically supporting the LSI being formed on all the remaining three sides.

The configuration of the electrical connecting portion between the optical interface module 7 and the interposer 2 is not limited to the configuration shown in FIG. 12. It is possible to modify the configuration of the electrical connecting portion appropriately. For example, it is possible to employ the configuration that an anisotropic conductive film is formed on the side of the interposer 2, and an electrode pad is formed on the side of the module 7. Since the anisotropic conductive film exhibits a plasticity relative to the pressurization so as to sink in an amount of scores of microns to hundreds of microns depending on the pushing pressure (depending on the thickness of the film), it is possible to absorb the non-uniformity in the difference in level between the LSI 1 and the optical interface module 7.

In the case of using an anisotropic conductive film, the adjustable range of the height is smaller than that in the case of employing the pin structure described previously. However, the particular configuration can be formed by the ordinary process by forming a coupling hole for burying the jack structure 10 in the interposer 2 without adding a special process for attaching, for example, pins to the optical interface module 7 so as to produce the effect of lowering the costs of the interposer 2 and the optical interface module 7.

Seventh Embodiment

Figure 15:
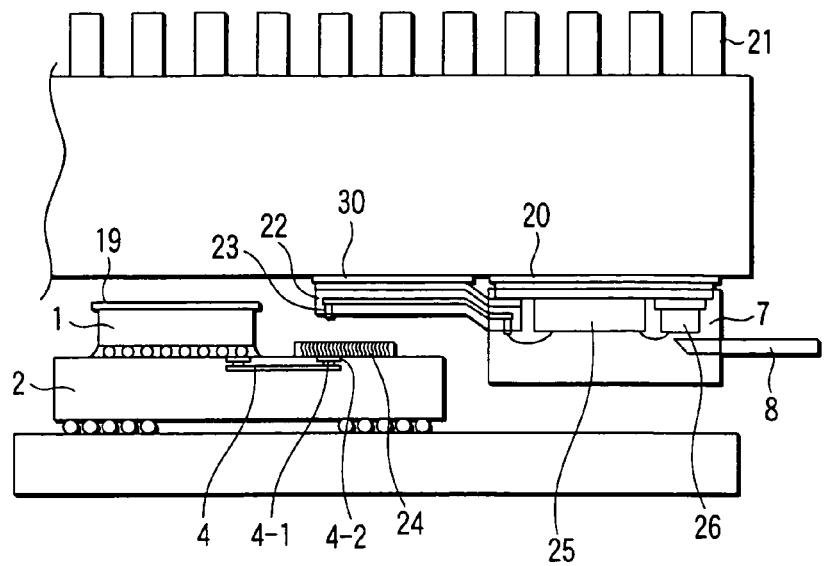
FIG. 15 is a cross sectional view schematically showing an LSI package comprising a high-speed interface module according to a seventh embodiment of the present invention during the assembling process.
Figure 16:
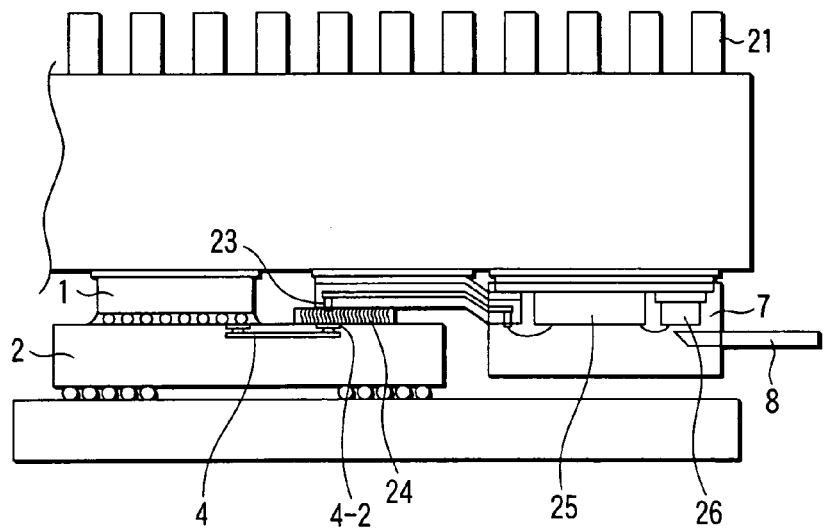
FIG. 16 is a cross sectional view schematically showing the assembled structure of the LSI package shown in FIG. 15.
Figure 17:
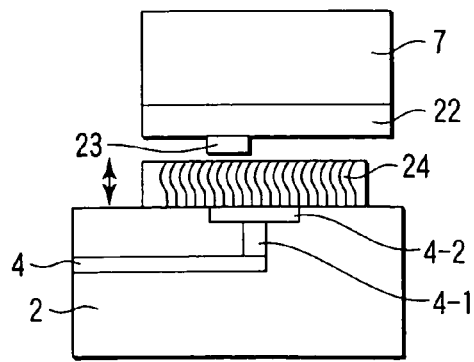
FIG. 17 is a cross sectional view showing in a magnified fashion a part of the connection structure between the optical interface module and the interposer shown in FIG. 16.

FIGS. 15 and 16 are directed to an LSI package comprising a high-speed interface module according to a seventh embodiment of the present invention, wherein FIG. 15 is a cross sectional view showing the state before the optical interface module is connected to the interposer 2, and FIG. 16 is a cross sectional view showing the state after the optical interface module is connected to the interposer 2. FIG. 17 is a cross sectional view showing the configuration of the electrical connecting portion shown in FIGS. 15 and 16. Incidentally, the members of the package shown in FIGS. 15 to 17, which are equal to those shown in FIG. 1, are denoted by the same reference numerals so as to omit the detailed description thereof.

As shown in FIG. 15, the signal processing LSI 1 is mounted to the interposer 2, and the input-output terminal of the signal processing LSI 1 is connected to pads 4-2 on the peripheral portion of the signal processing LSI 1 on the surface of the interposer 2 through the electrical wiring 4 within the interposer 2. Therefore, the input signal to the signal processing LSI 1 is transmitted from the input pads 4-2 through the electrical wiring 4 within the interposer 2, and the output signal generated from the signal processing LSI 1 is transmitted to the output pads 4-2 through the electrical wiring 4 within the interposer 2.

As shown in FIG. 17, the signal wiring 4 inside the interposer 2 is exposed to the surface via a metal post 4-1, and the electrode pad 4-2 is formed on the exposed portion. Further, an anisotropic conductive film 24 having a plasticity relative to the pressurization is attached to the interposer 2 so as to be brought into contact with the electrode pad 4-2. Since the anisotropic conductive film 24 exhibits a plasticity so as to sink in an amount of scores of microns to hundreds of microns when the film 24 is electrically connected as shown in FIG. 16, it is possible for the film 24 to absorb the difference in level between the LSI 1 and the optical interface module 7.

The anisotropic conductive film 24 has an adjustable range of the height smaller than that in the case of employing the pin structure described previously. However, the particular configuration can be formed by the ordinary process by forming a coupling hole for burying the jack structure 10 in the interposer 2 without adding a special process for attaching, for example, the pin 9 to the optical interface module 7. As a result, it is possible to lower the costs of the interposer 2 and the optical interface module 7. Incidentally, this configuration also produces the effect of having a mounting allowance in the lateral direction corresponding to the size in the planar direction of the electrode pads 4-2 and 23.

On the other hand, the optical interface module 7 is fixed to the heat sink 21 by a heat conductive adhesive layer 20 having a suitable thickness as shown in FIG. 15. An electrical input-output section 22 of the optical interface module 7 is formed of, for example, a flexible wiring film including a polyimide film as a base material, and the solid electrode on the upper surface is fixed to the heat sink 21 by an adhesive layer 30. Since heat is scarcely generated from the electrical input-output section 22, it is unnecessary for the adhesive layer 30 to have a heat conductivity. The electrode post 23 exposed to the surface is mounted to the flexible wiring film 22. The electrode post 23 is pushed by the anisotropic conductive film 24 when the heat sink 21 is pushed by the LSI 1 so as to obtain an electrical contact as shown in FIG. 17.

The electrode post 23 of the flexible wiring film 22 is guided into the package of the body of the optical interface module 7 so as to be electrically connected to an interface IC 25 in the exposed portion within the package by a gold wire or a solder bump. Housed in the package are an optical element 26 electrically connected to the interface IC 25 by a gold wire or a solder bump and the optical fiber 8, and the optical element 26 and the optical fiber 8 are optically coupled with each other.

As in the other embodiments described previously, it is possible to arrange the interface IC 25, the optical element 26 and the optical fiber 8 outside the interposer 2. However, according to the configuration for the seventh embodiment, it suffices for the thickness of the optical interface module 7 arranged on the interposer 2 to be substantially equal to the sum of the thickness of the flexible wiring film 22 and the thickness of the adhesive layer 30. It follows that, in this case, the signal processing LSI 1 can be made very thin and, thus, the particular configuration can be applied to the case where the clearance between the interposer 2 and the heat sink 21 is so small that it is difficult to mount, for example, pins to the optical interface module 7.

For example, it is possible to decrease the thickness of the adhesive layer 30 and the thickness of the wiring film 22 to about 30 μm and 50 μm, respectively. Also, the thickness of the anisotropic conductive film 24 can be decreased to about 100 μm (e.g., MT-T type film manufactured by Shin-etsu Polymer K.K.). It follows that the particular configuration can be realized even in the case where the thickness of the signal processing LSI 1 is decreased to about 200 μm. In addition, according to the particular configuration, it suffices for the optical interface module 7 to have a suitable thickness as far as the optical interface module 7 can be arranged between the heat sink 21 and the mounting board 6, and the non-uniformity in the difference in level between the optical interface module 7 and the signal processing LSI 1 need not be considered. Also, since the non-uniformity in the difference in thickness between the signal processing LSI 1 and the electrical input-output section 22 can be absorbed by the sinking amount of the anisotropic conductive film 24 having a flexibility, the heat sink 21 can be used commonly.

According to the configuration shown in FIG. 15, the wiring for a high-speed transmission is arranged inside the package substrate, and the pins need not be connected to a coupling mechanism, with the result that the wiring for a high-speed transmission can be formed of the surface layer wiring alone. It follows that the impedance can be controlled easily so as to obtain the effect of improving the high frequency characteristics.

Figure 18:
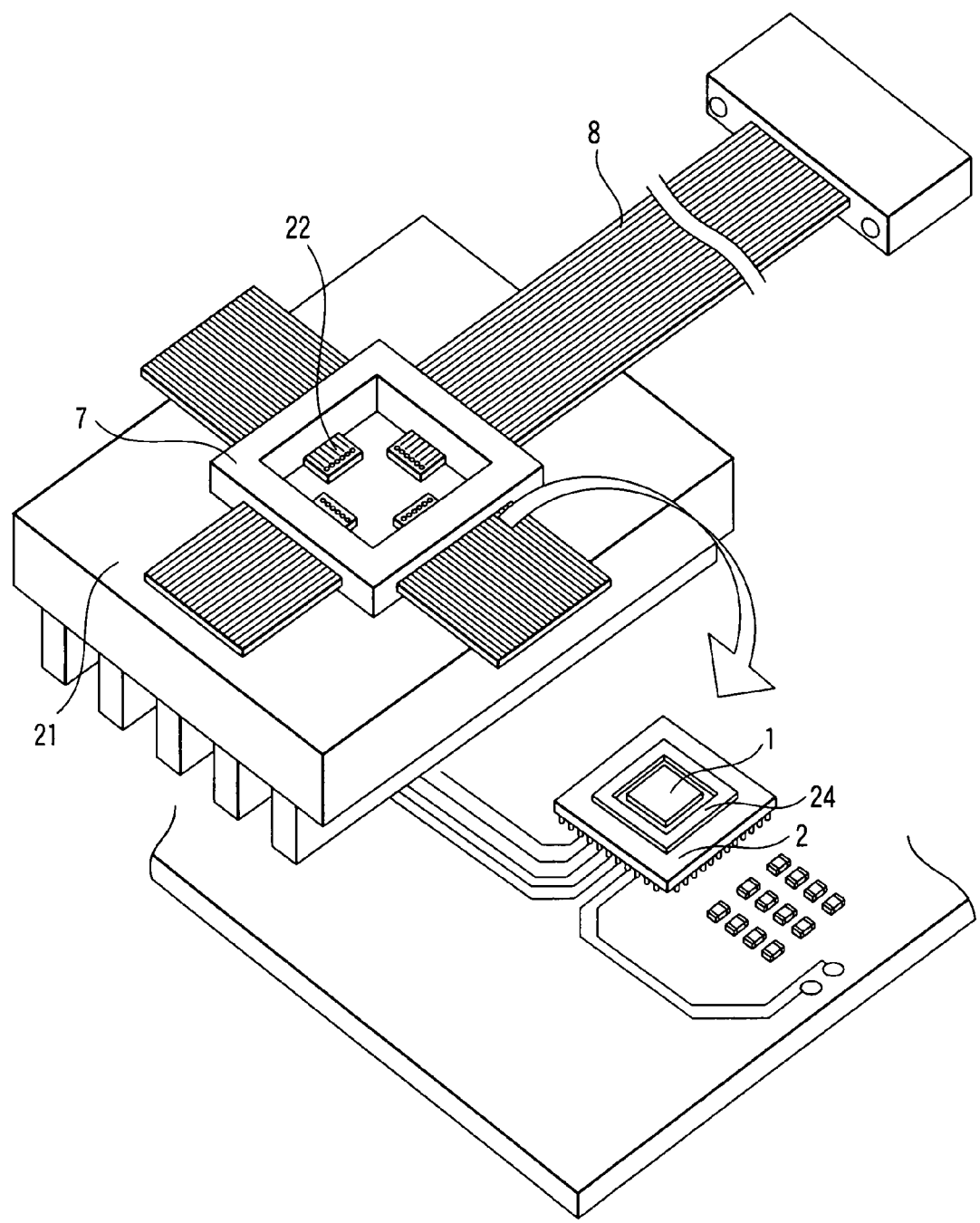
FIG. 18 is an oblique view showing in a dismantled fashion the mounting procedure of the LSI package shown in FIG. 16.

The mounting procedure for this embodiment will now be described with reference to FIG. 18. As shown in FIG. 18, the optical interface module 7 is fixed to the heat sink 21 by a heat conductive adhesive layer or a solder layer having an appropriate thickness, and the electrical input-output section 22 is fixed to the optical interface module 7 by another adhesive layer 30. A heat conductive paste material layer 19 is inserted onto the upper surface, i.e., the exposed surface, of the signal processing LSI 1, and the electrical connection terminal is aligned as denoted by an arrow put to the optical interface module comprising a heat sink so as to mount the electrical connection terminal. The heat sink 21 is pressurized by an external holder (not shown) in the direction in which the heat sink 21 is pushed against the LSI 1. In this step, the flexible anisotropic conductive film 24 is sunk so as to absorb the non-uniformity of the thickness and is pressurized until the heat conductive paste material layer on the upper surface of the signal processing LSI is caused to have an appropriate thickness so as to be fixed.

Because of the particular configuration, it is possible to ensure a heat conductive adhesive layer or the like having a thickness appropriate for each of the LSI 1 and the optical interface module 7 so as to maintain the electrical connection between the interposer 2 and the optical interface module 7 by suppressing the elevation of the thermal resistance.

Also, the electrical connection section need not be arranged on the upper surface of the interposer 2. As described herein later with reference to FIGS. 22 and 23, it is possible for the electrical connection section to be arranged so as to be electrically connected on the side surface of the interposer 2.

The electrical connecting section is not limited to that in the embodiment described above. Specifically, it is possible for the electrical connecting section to be formed by utilizing a bump metal such as gold formed on the wiring pad as shown in FIGS. 19 and 20.

Eighth Embodiment

Figure 19:
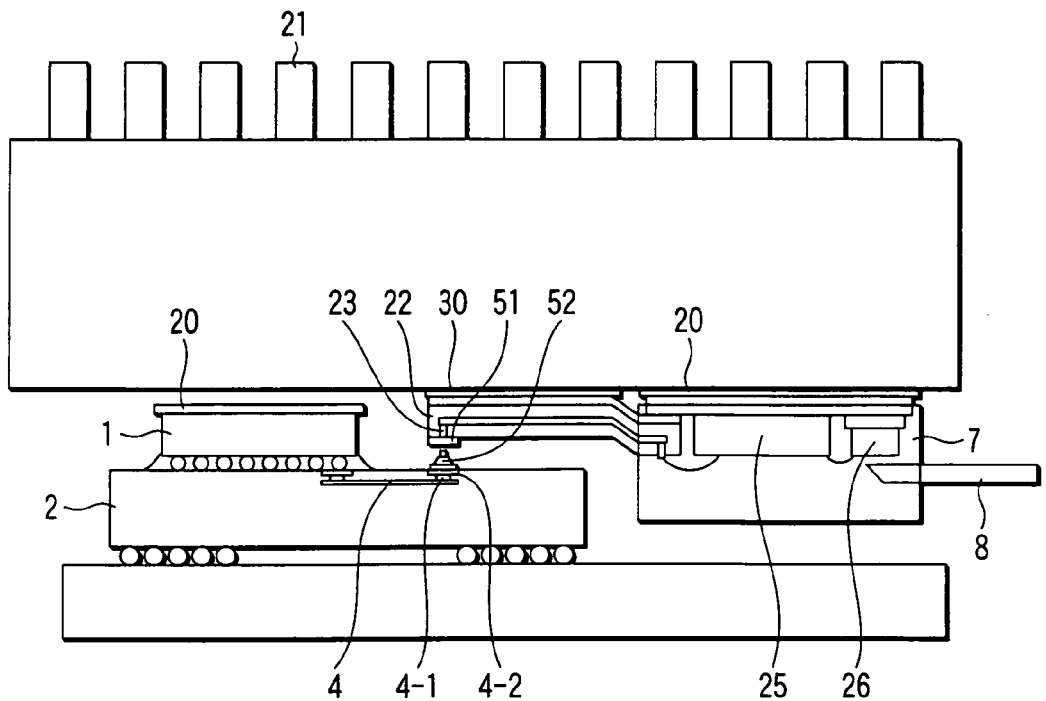
FIG. 19 is a cross sectional view schematically showing an LSI package comprising a high-speed interface module according to an eighth embodiment of the present invention during the assembling process.
Figure 20:
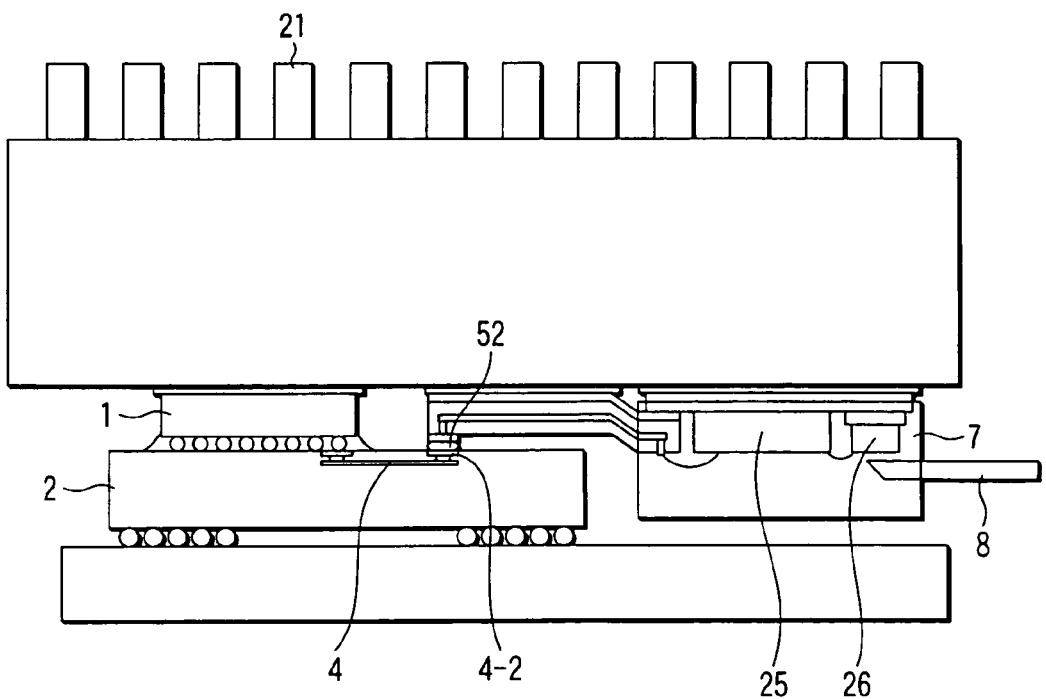
FIG. 20 is a cross sectional view schematically showing the assembled structure of the LSI package shown in FIG. 19.

FIGS. 19 and 20 are directed to an LSI package comprising a high-speed interface module according to an eighth embodiment of the present invention, wherein FIG. 19 is a cross sectional view showing the state before the optical interface module 7 is connected to the interposer 2, and FIG. 20 is a cross sectional view showing the state after the optical interface module 7 is connected to the interposer 2. FIGS. 21A and 21B are cross sectional views showing the configuration of the electrical connecting portion having the height adjusting function shown in FIGS. 19 and 20. Further, FIG. 21C is a cross sectional view showing the configuration of the electrical connecting section provided with a plurality of bumps. Incidentally, the members of the LSI package shown in FIGS. 19 to 21, which are equal to those shown in FIG. 1, are denoted by the same reference numerals so as to omit the detailed description thereof.

As shown in FIGS. 19 and 20, the signal processing LSI 1 is mounted on the interposer 2, and the signal input and output terminals of the signal processing LSI 1 are connected to pads on the interposer 2. These pads are connected to the electric wiring 4 inside the interposer 2, and the electric wiring 4 is connected to the connecting section formed in the peripheral portion of the signal processing LSI 1 on the surface of the interposer 2.

As shown in FIG. 21A, the signal wiring 4 inside the interposer 2 extends onto the surface of the interposer 2 through a post metal 4-1 so as to be connected to the electrode pad 4-2 formed in an exposed fashion on the surface of the interposer 2. Also, a bump metal 52 made of, for example, Au or Al is formed on the electrode pad 4-2, and an electrode pad 51 is formed on the interface module 7 in a manner to face the bump metal 52. The electrode pad 51 is connected by the contact bonding to the electrode pad 4-2 with the bump metal 52 interposed therebetween. Before the electrode pad 51 is connected by the contact bonding to the electrode pad 4-2, the electrode pad 51 and the electrode pad 4-2 are simply held in an electric contact with each other such that the bump metal 52 is not collapsed relatively as shown in FIG. 21A. On the other hand, after the electrode pad 51 is connected to the electrode pad 4-2 by the contact bonding, pressure is applied between the electrode pad 51 and the electrode pad 4-2 so as to collapse the bump metal 52, with the result that the electrode pad 51 is electrically connected to the electrode pad 4-2 with a short connecting distance. Since it is possible to control the collapsing amount of the bump 52 by scores of microns in this fashion, the bump 52 performs the function of a height adjusting mechanism so as to make it possible to absorb the non-uniformity in the difference in level between the LSI 1 and the interface module 7. Further, if a plurality of bump metals are used for achieving a single electrical connection as shown in FIG. 21C, it is possible to absorb the deviation of the mounting position in the lateral direction even in the case where the electrode pad 4-2 on the side of the interposer 2 differs in size from the electrode pad 51 on the side of the interface module.

Ninth Embodiment

Figure 22:
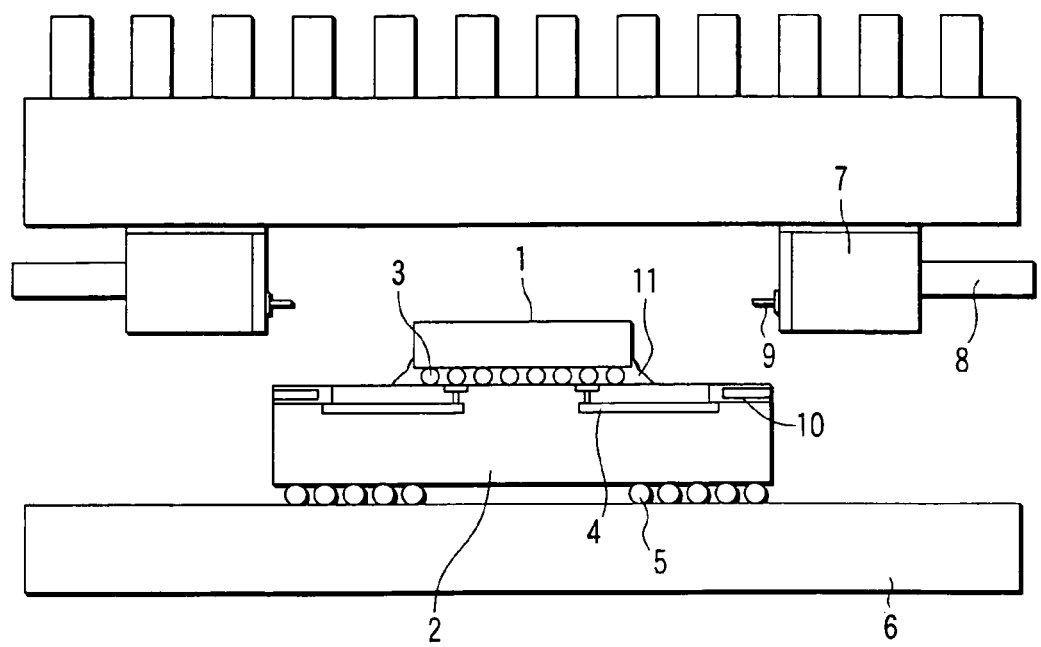
FIG. 22 is a cross sectional view schematically showing an LSI package comprising a high-speed interface module according to a ninth embodiment of the present invention during the assembling process.
Figure 23:
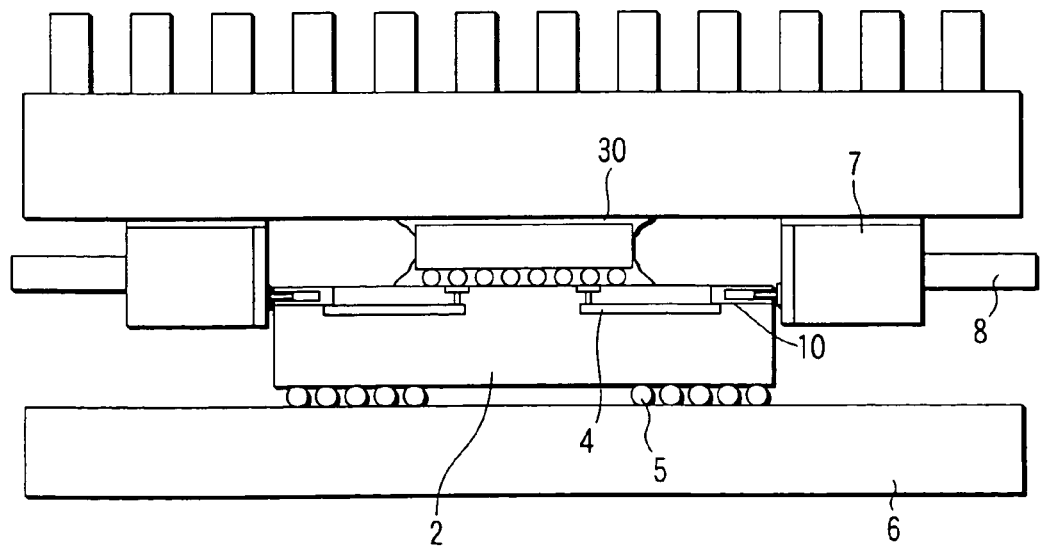
FIG. 23 is a cross sectional view schematically showing the assembled structure of the LSI package shown in FIG. 22.
Figure 24A:
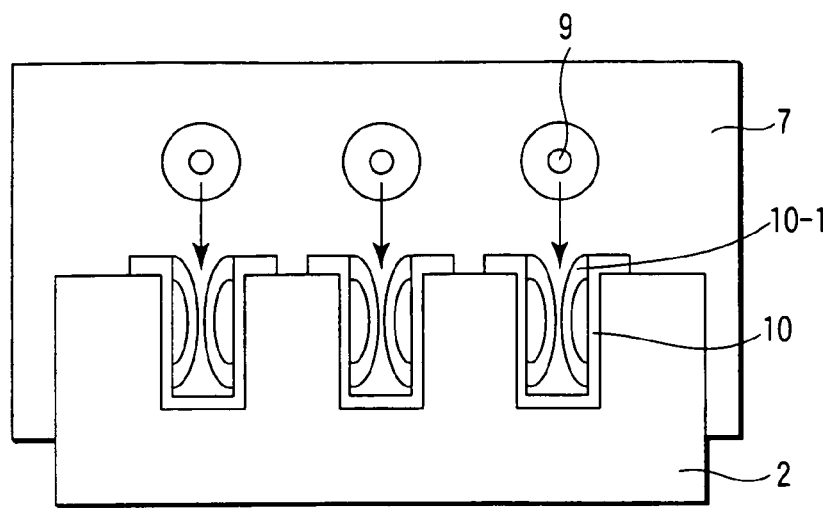
FIGS. 24A to 24C are cross sectional views showing the configuration of the electrical connection section.
Figure 24B:
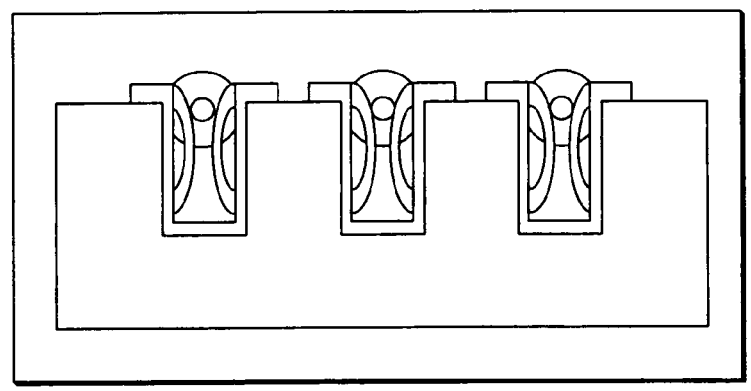
Figure 24C:
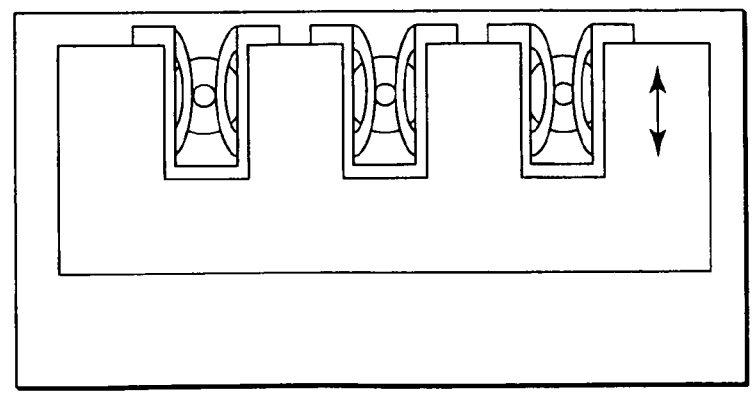

FIGS. 22 and 23 are directed to an LSI package comprising a high-speed interface module according to a ninth embodiment of the present invention, wherein FIG. 22 is a cross sectional view showing the state before the optical interface module 7 is connected to the interposer 2, and FIG. 22 is a cross sectional view showing the state after the optical interface module 7 is connected to the interposer 2. FIGS. 24A to 24C are cross sectional views each showing the configuration of the electrical connecting section and collectively showing the process of connecting the electrical connecting sections to each other. Incidentally, the members of the package shown in FIGS. 22 to 24, which are equal to those shown in FIG. 1, are denoted by the same reference numerals so as to omit the detailed description thereof.

The electrical connecting section 10 is formed in the shape of a vertical groove in the peripheral edge portion on the side surface of the interposer 2 as shown in FIG. 24A, and an electrical connecting section 9 of the interface module 7 is inserted from above into the electrical connecting section 10 as shown in FIGS. 24B and 24C. In the configuration employed in the ninth embodiment of the present invention, the position of the electrical connecting section 9 can be controlled in the vertical direction as shown in FIGS. 22 and 24C while maintaining the state that the electrical connecting section 9 is inserted into the electrical connecting section 10. According to the particular configuration, degree of freedom is generated in the arrangement of each section because the thickness in the electrical connecting section of the interface module 7 is not limited by the height of the signal processing LSI 1.

The present invention is not limited to each of the embodiments described above and can be modified as follows.

Modified Embodiments

Figure 25:
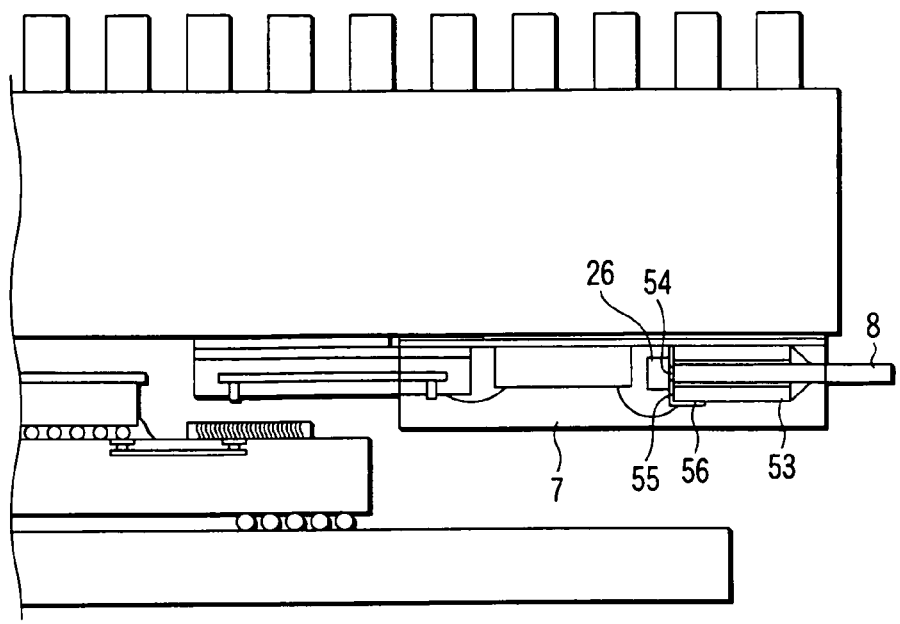
FIG. 25 is a cross sectional view schematically showing a modification of a part of an LSI package comprising a high-speed interface module of the present invention.
Figure 26:
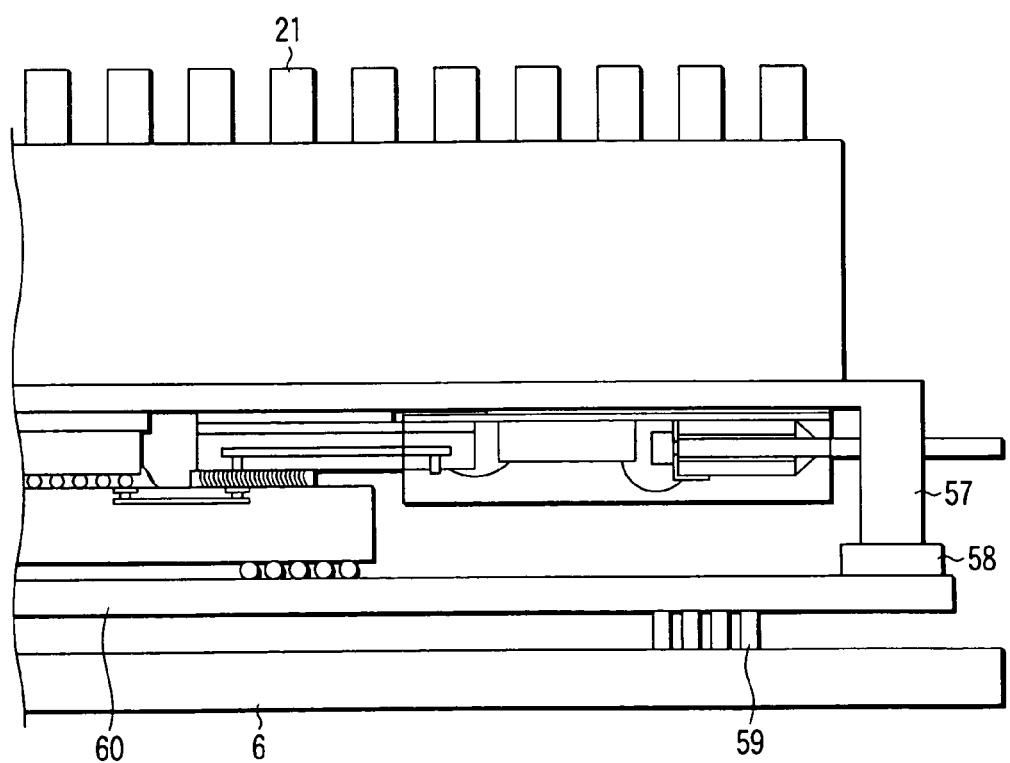
FIG. 26 is a cross sectional view schematically showing another modification of a part of an LSI package comprising a high-speed interface module of the present invention.

In the various embodiments described above, the optical connection between the optical element within the optical interface module 7 and the optical fiber is achieved by fixing the obliquely polished optical fiber above the active region of the optical element. As a modification, it is possible for the optical fiber 8 to be held by a holding member 53 such that the edge face 54 of the optical fiber 8 is exposed to the outside. It is also possible for the optical element 26 to be arranged in the edge face 55 of the holding member 53 to which the fiber edge face 54 is exposed so as to achieve a direct optical coupling between the fiber edge face 54 and the optical element 26 as shown in FIG. 25. Further, it is possible for an electrode 56 of the optical element 26 to be withdrawn onto the side section of the holding member 53 so as to be electrically connected to the driving IC. According to the particular arrangement, the positional alignment between the active region of the optical element 26 and the core of the optical fiber 8 need not be controlled, and the optical element 26 and the optical fiber 8 can be handled as a single integral part. It follows that the mounting capability of the apparatus can be improved, and the cost can be reduced. Also, in the optical interface module 7 shown in FIG. 25, the optical coupling section, the interface IC, the connecting wire, etc. are molded with, for example, a resin. However, it is not absolutely necessary to mold these members, and it is possible to employ the configuration free from the molding as shown in FIG. 26 when it comes to the MCM configuration that is sealed outside the module. The structure 57 shown in FIG. 26 is sealed to an MCM substrate 60 by the heat lid with an adhesive layer 58 interposed therebetween and is thermally connected to the heat sink 21. Pins 59 for the wiring to the outside are formed on the MCM substrate 60 so as to permit the MCM substrate 60 be connected to the mounting board 6. The particular configuration permits decreasing the number of parts used so as to decrease the number of manufacturing steps, leading to the cost reduction.

Figure 27:
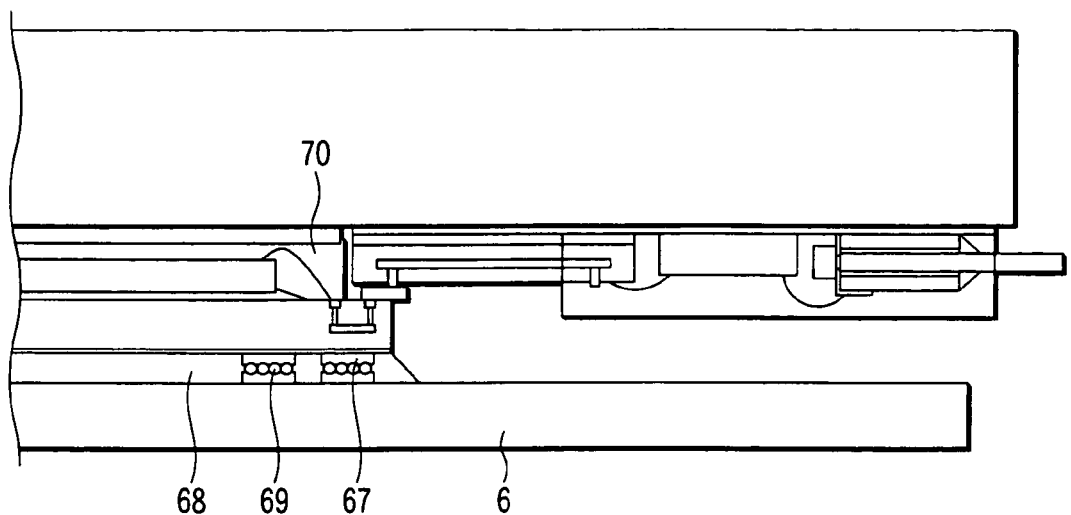
FIG. 27 is a cross sectional view schematically showing another modification of a part of an LSI package comprising a high-speed interface module of the present invention.

Further, the signal processing LSI is not limited to the package using a resin-molded substrate or an under-filled BGA substrate. It is possible for the LSI package to be a land grid array (LGA). In the particular LSI package, the LSI package is mounted to the mounting board 6 by using an anisotropic conductive resin as shown in FIG. 27. Also, the electrical connection means between the LSI and the interposer 2 is not limited to bumps. The package by LGA is featured in that the pin pitch can be made narrower, compared with PGA or BGA, so as to diminish the mounting area. It follows that the LGA package is effective in the case of utilizing a large scale LSI requiring a very large number of pins. A reference numeral 70 shown in FIG. 27 denotes a wire for connecting the signal processing LSI 1 to the electrode of the interposer 2, a reference numeral 67 denotes LGA, and a reference numeral 68 denotes an anisotropic conductive resin containing conductive particles 69.

Figure 28:
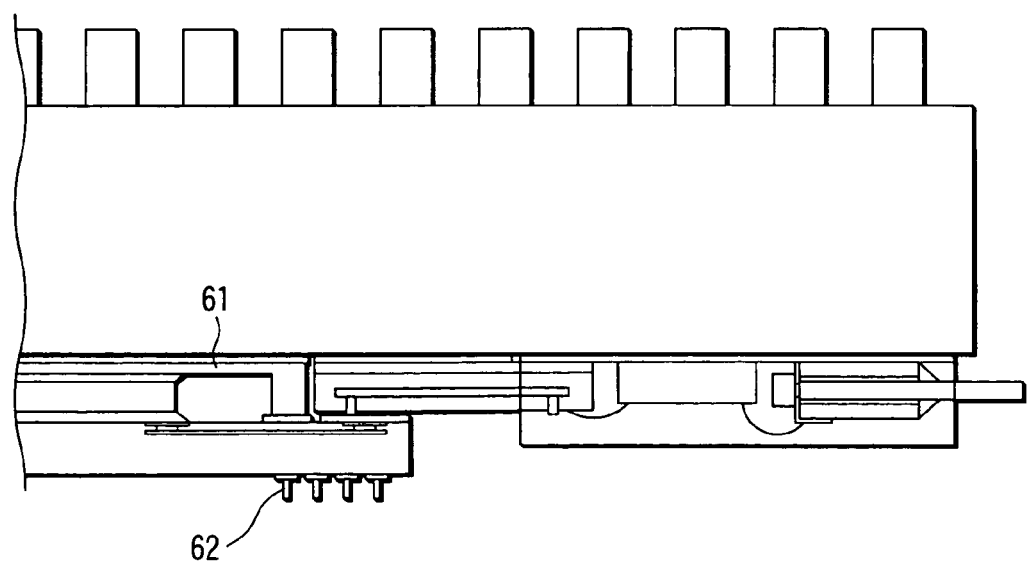
FIG. 28 is a cross sectional view schematically showing another modification of a part of an LSI package comprising a high-speed interface module of the present invention.
Figure 29:
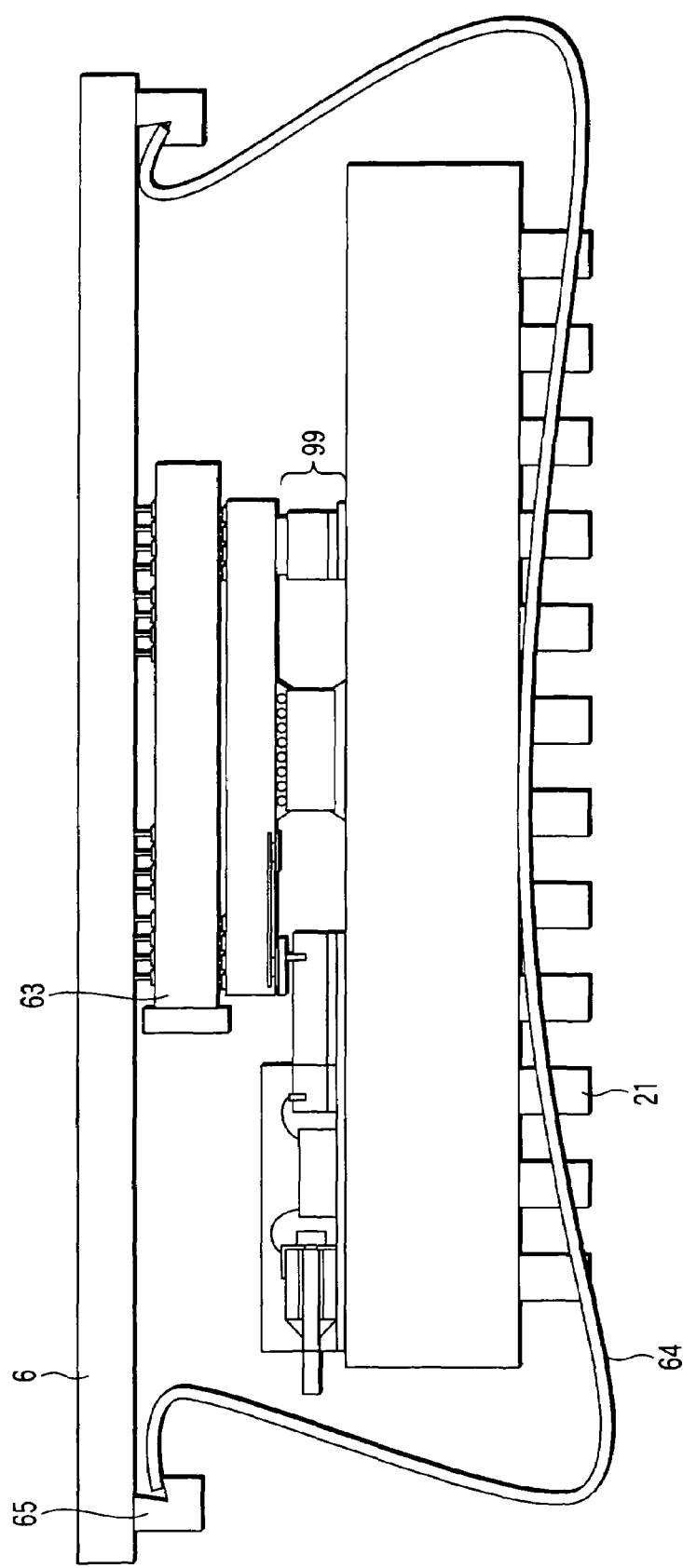
FIG. 29 is a cross sectional view schematically showing another modification of a part of an LSI package comprising a high-speed interface module of the present invention.
Figure 30:
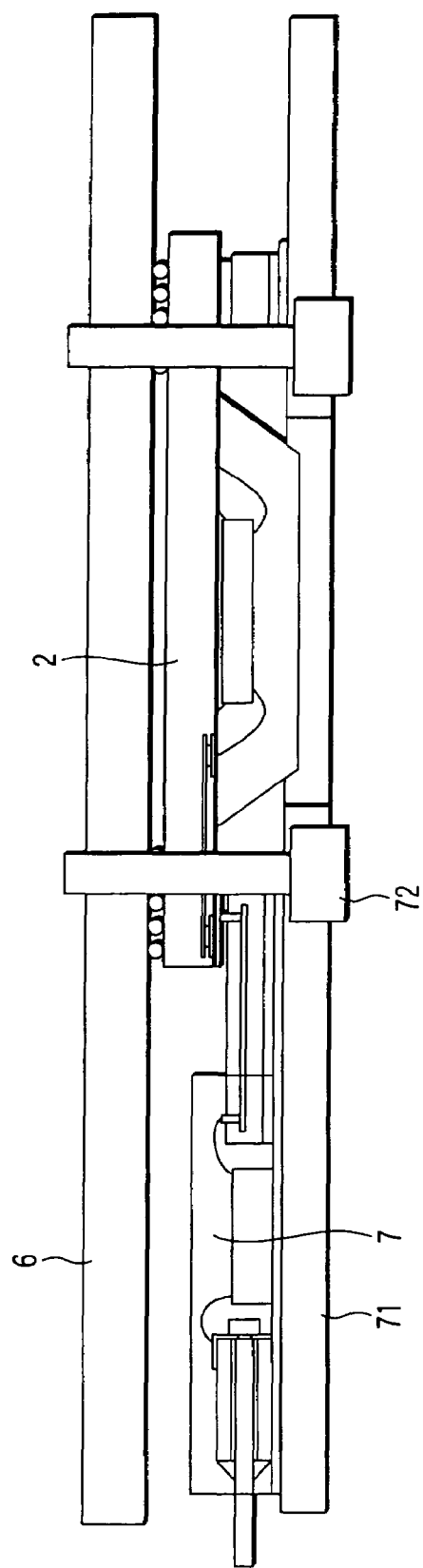
FIG. 30 is a cross sectional view schematically showing another modification of a part of an LSI package comprising a high-speed interface module of the present invention.
Figure 31:
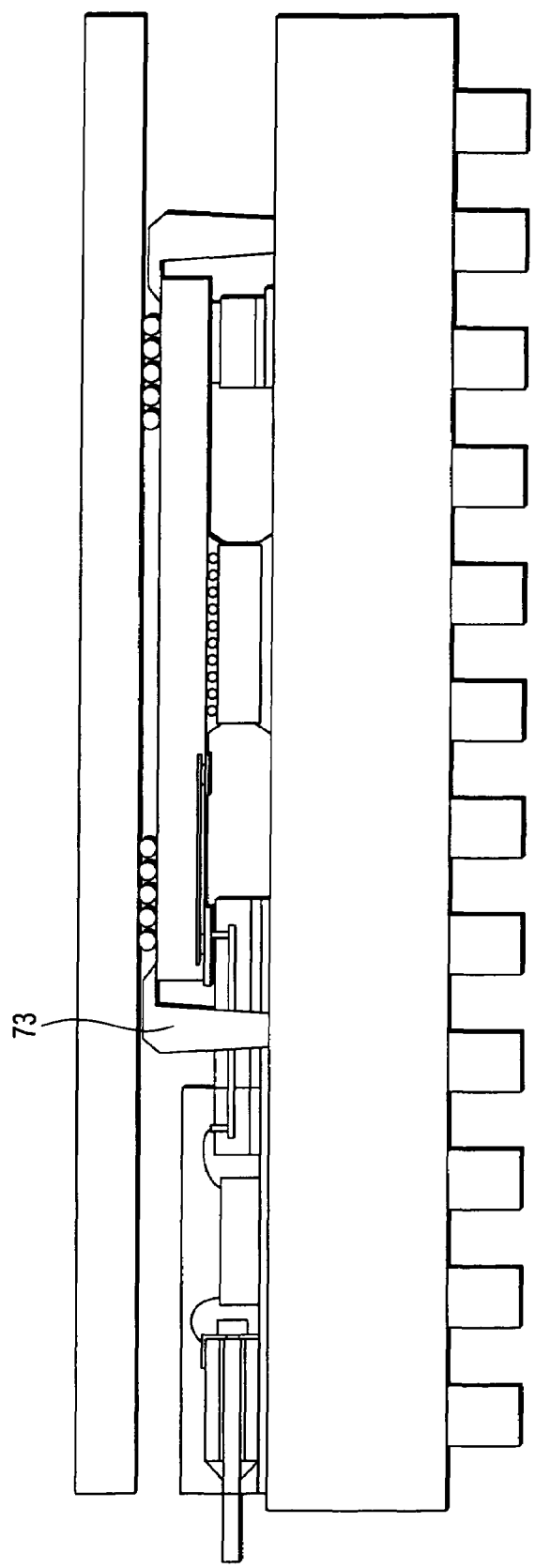
FIG. 31 is a cross sectional view schematically showing still another modification of a part of an LSI package comprising a high-speed interface module of the present invention.

Also, in the configuration that a heat lid 61 is formed on the interposer 2 as shown in FIG. 28, it is possible to use a pin grid array (PGA) 62 for the connection between the interposer 2 and the mounting board. In the particular configuration, the signal processing LSI 1 is sealed by the heat lid and, thus, it is possible to prevent the breakage such as breakage of the LSI chip in mounting the interface module 7 together with the heat sink 21. Further, the configuration for mounting the PGA package to a socket 63 as shown in FIG. 29 can be employed for mounting the PGA to the mounting board 6. In the configuration shown in FIG. 29, the signal processing LSI is mounted on the interposer 2 with a resinous under-fill. The signal processing LSI 1 can be mounted to the interposer 2 by using a heat lid in place of the resinous under-fill. A reference numeral 64 shown in FIG. 29 denotes a pressing member of the heat sink 21. The pressing member 64 is caught by a retention 65 arranged on the mounting board 6 so as to cause the heat sink 21 to be pushed downward by the elastic force of the pushing member 64 so as to fix the heat sink 21. In the case of employing the particular configuration, both the LSI package and the heat sink comprising a interface module can be renewed after the mounting so as to make it possible to cope with the renewal caused by the defect occurrence and with the renewal of the version. A reference numeral 66 shown in FIG. 29 denotes a dummy module arranged to face the interface module 7. The dummy module 66 has a mechanical configuration alone in the electrical connecting section in order to prevent the apparatus from being inclined by the load in the case of arranging the interface module on one side alone of the signal processing LSI. It is possible for the mechanism for applying the load to be formed of screws as shown in FIG. 30. The mechanism for applying the load is capable of controlling more finely the load applied to the electrical connecting section between the interposer 2 and the interface module 7. A reference numeral 72 shown in FIG. 30 denotes a screw. The interface module 7 is arranged on a support substrate 71, and the load is applied through the screw holes formed in the support substrate 71 and the mounting board 6. Also, the pushing mechanism is constructed such that a hook 73 is formed in the heat sink 21 as shown in FIG. 31, and the hook 73 is engaged with the interposer 2 so as to fix the heat sink 21. In this configuration, the hook 73 is once expanded and, then, locked so as to prevent the interface module from being detached erroneously. In this case, the downward pushing force after the locking is slightly lowered, compared with the pushing force immediately before the locking. However, the lowered pushing force can be absorbed by the electrical connection having a height adjusting mechanism such as a contactor.

Also, in the embodiments described above, an optical fiber is used as the transmission line. However, a similar effect can be obtained in the case of using an electrical transmission line such as a coaxial cable, a semi-rigid cable or a flexible wiring plate. To be more specific, it is possible for the optical interface module to be replaced by an interface module housing a line driver IC for the line driving, an electrical transmission line, a means for connecting the electrical transmission line to the output of the line driver IC (such as a solder bump or a wire bonding), and an input-output electric terminal connected to the input-output signal of the signal processing LSI outside the interface module.

As described above, in the present invention, the interface module of the pigtail type (the configuration in which one end of the transmission line is included in the interface module) is housed in a separate package together with the optical coupling mechanism and the electrical connection holding mechanism so as to miniaturize the apparatus. Also, the interface module and the interposer 2 are electrically connected to each other through the electrical connection terminals thereof by the mechanical contact. As a result, the present invention makes it possible to overcome the problems described previously.

To be more specific, since the interface module is mounted directly to the interposer 2, the length of the electrical wiring between the signal processing LSI and the interface module can be shortened so as to mount the interface module of a high throughput without requiring a more expensive transmission line. Also, since the external wiring of the interface module is coupled directly in place of the coupling using a connector, the configuration of the interface module is prevented from being made complex. Further, since the interposer 2 and the interface module can be coupled with each other by the electrical connection terminals, it is possible to prevent the problem that an interference is generated between the soldering of the interposer and the soldering of the interface module.

It should also be noted that, since the interface module is fixed to the heat sink and a height adjusting function is imparted to the electrical connection terminal, it is possible to absorb the difference in height between the LSI and the interface module. As a result, the difference in thickness between the LSI and the interface module can be absorbed even in the case where the LSI and the interface module generate a large amount of heat so as to make it necessary to use the heat sink commonly. It follows that it is possible to realize an LSI package comprising a cheap interface module capable of suppressing the elevation of the thermal resistance.

Further, the second and third embodiments described previously can be combined suitable with the embodiments other than the first embodiment, i.e., the fourth to eighth embodiments. Of course, the present invention can be modified in various other fashions within the technical scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An LSI package arranged on a mounting board and configured to be provided with a heat dissipation member, comprising:
   an LSI configured to process signals, the LSI having signal input and output terminals and a surface to be coupled to the heat dissipation member;
   an interposer configured to mount the LSI, and including first signal terminals electrically connected to the signal input and output terminals of the LSI, second electric terminals for electrically connecting the LSI to the mounting board, internal wirings electrically connected to the first signal terminals, and first coupling parts electrically connected to the internal wirings; and
   an interface module including signal transmission lines configured to transmit the signals to outside and to receive the signals from outside, second coupling parts electrically connected to the signal transmission lines, and a package structure configured to hold the signal transmission lines and the second coupling parts, the second coupling parts being electrically connected to the first coupling parts by means of mechanical contact, respectively, and the package structure being mounted on the interposer and having a through-opening to receive the LSI to allow the heat dissipation member to be located above the surface of the LSI.

2. The LSI package according to claim 1, wherein:
   the interposer has front and rear surfaces opposed to each other;
   the LSI is mounted on the front surface of the interposer and the second electric terminal is provided on the rear surface of the interposer; and
   the interface module further includes an input-output element configured to output the signals to the signal transmission lines and to input the signals from the signal transmission lines, the second coupling parts being electrically connected to the input-output element and the input-output element being provided in the package structure.

3. The LSI package according to claim 1, wherein the interposer has front and rear surfaces opposed to each other, the LSI is mounted on the front surface of the interposer, and the first coupling parts are arranged along two sides or four sides of the LSI on the front surface of the interposer.

4. The LSI package according to claim 1, wherein a heat sink is fixed to an upper surface of the interface module and disposed over the space of the package structure, the heat sink functioning as the heat dissipation member.

5. The LSI package according to claim 1, wherein the first coupling parts are provided on the front surface of the interposer.

6. A LSI package arranged on a mounting board and having a configuration for mounting a heat dissipation member, comprising:
   an LSI configured to process signals, the LSI having signal input and output terminals and a surface to be coupled to the heat dissipation member;
   an interposer configured to mount the LSI, and including first signal terminals electrically connected to the signal input and output terminals of the LSI, second electric terminals for electrically connecting the LSI to the mounting board, internal wirings electrically connected to the first signal terminals, and first coupling parts electrically connected to the internal wirings; and an interface module including signal transmission lines configured to transmit the signals to outside and to receive the signals from outside, second coupling parts electrically connected to the signal transmission lines, and a package structure configured to hold the signal transmission lines and the second coupling parts, the package structure being mounted on the interposer and having a through-opening to receive the LSI to allow the heat dissipation member to be located on the surface of the LSI, and the second coupling parts being electrically connected to the first coupling parts, the first or second or both coupling parts being provided with a mechanism of adjusting the gap height between the interface module and the interposer.

7. The LSI package according to claim 6, wherein the interposer has front and rear surfaces opposed to each other, wherein the LSI is mounted on the front surface of the interposer and the second electric terminal is provided on the rear surface of the interposer;

wherein the interface module further includes an input-output element configured to output the signals to the signal transmission lines and to input the signals from the signal transmission lines, the second coupling parts being electrically connected to the input-output element and the input-output element being provided in the package structure.

8. The LSI package according to claim 6, wherein one of the first and second coupling parts includes coupling pins and the other of the first and second coupling parts includes insertion structures configured to receive the coupling pins and fix the coupling pins.

9. The LSI package according to claim 6, wherein the first and second coupling parts includes electrode pads, and an anisotropic conductive film is provided between the electrode pads to couple the electrode pads.

10. The LSI package according to claim 6, wherein one of the interface module and the interposer includes a guide pin mounted thereon and the other of the interface module and the interposer includes a guide hole to which the guide pin is inserted.

11. The LSI package according to claim 6, wherein the interface module further includes third electric terminals for electrically connecting the interface module to the mounting board.

12. The LSI package according to claim 6, wherein the interposer has front and rear surfaces opposed to each other, the LSI is mounted on the front surface of the interposer, and the first coupling parts are arranged along two sides or four sides of the LSI on the front surface of the interposer.

13. The LSI package according to claim 6, wherein the signal transmission line include optical waveguides, and the interface module has an optical element configured to convert the electric signals to the output optical signals and guide the output optical signals to the optical waveguide, and interface integrated circuits configured to drive electrically the optical elements.

14. The LSI package according to claim 6, wherein the first coupling parts are provided on the front surface of the interposer.

15. The LSI package according to claim 6, wherein the second coupling parts are electrically connected to the first coupling parts by means of mechanical contact, and when the mechanical contact being provided, a thermal coupling between the LSI and the heat dissipation member being maintained.

16. The LSI package according to claim 7, wherein the interface module further includes a flexible electric wiring film coupled between the input-output element and the second coupling parts.

17. The LSI package according to claim 16, further comprising:

an anisotropic conductive film which has reversibility of thickness interposed between the first and second coupling parts.

18. An LSI package arranged on a mounting board, comprising:

an LSI configured to process signals, the LSI having signal input and output terminals;

an interposer configured to mount the LSI, and including first signal terminals electrically connected to the signal input and output terminals of the LSI, second electric terminals for electrically connecting the LSI to the mounting board, internal wirings electrically connected to the first signal terminals, and first coupling parts electrically connected to the internal wirings; and an interface module including optical waveguides which transmit output optical signals to outside and to receive input optical signals from outside, an optical element configured to convert the input optical signals from the optical waveguides to the electric signals, convert the electric signals to the output optical signals and guide the output optical signals to the optical waveguide, and interface integrated circuits configured to drive the optical elements, and second coupling parts electrically connected to the optical element, the second coupling parts being electrically connected to the first coupling parts by means of mechanical contact, respectively.

19. The LSI package according to claim 18, wherein the interposer has front and rear surfaces opposed to each other, the LSI is mounted on the front surface of the interposer, and the first coupling parts are arranged along two sides or four sides of the LSI on the front surface of the interposer.

* * * * *